US012622155B2

(12) United States Patent
Ha et al.

(10) Patent No.: US 12,622,155 B2
(45) Date of Patent: May 5, 2026

(54) DISPLAY DEVICE

(71) Applicant: Samsung Display Co., Ltd., Yongin-si (KR)

(72) Inventors: Seung Hwa Ha, Hwaseong-si (KR); Seung Ho Jung, Hwaseong-si (KR); In Woo Jeong, Asan-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 511 days.

(21) Appl. No.: 18/078,992

(22) Filed: Dec. 11, 2022

(65) Prior Publication Data

US 2023/0105445 A1 Apr. 6, 2023

Related U.S. Application Data

(63) Continuation of application No. 17/146,395, filed on Jan. 11, 2021, now Pat. No. 11,527,736.

(30) Foreign Application Priority Data

Apr. 17, 2020 (KR) ........................ 10-2020-0046558

(51) Int. Cl.
*H10K 59/80* (2023.01)
*H10K 59/12* (2023.01)
*H10K 102/00* (2023.01)

(52) U.S. Cl.
CPC ............. *H10K 59/87* (2023.02); *H10K 59/12* (2023.02); *H10K 2102/311* (2023.02)

(58) Field of Classification Search
CPC ................................... H05K 5/00; H05K 7/00
See application file for complete search history.

(56) References Cited

U.S. PATENT DOCUMENTS

| | | | |
|---|---|---|---|
| 6,362,440 | B1 | 3/2002 | Karidis et al. |
| 6,628,267 | B2 | 9/2003 | Karidis et al. |
| 6,727,894 | B1 | 4/2004 | Karidis et al. |
| 9,009,984 | B2 | 4/2015 | Caskey et al. |
| 9,174,764 | B2 | 11/2015 | Kang |

(Continued)

FOREIGN PATENT DOCUMENTS

| | | |
|---|---|---|
| CN | 101324821 A | 12/2008 |
| CN | 201166819 Y | 12/2008 |

(Continued)

OTHER PUBLICATIONS

Notice of Allowance issued Aug. 10, 2022, in U.S. Appl. No. 17/146,395.

*Primary Examiner* — Jerry Wu
(74) *Attorney, Agent, or Firm* — CANTOR COLBURN LLP

(57) ABSTRACT

A display device includes: a display panel having an upper surface to display an image and a lower surface; a first support and a second support disposed on the lower surface of the display panel; a first hinge connecting a side of the first support and a side of the second support and defining a first axis; a cover disposed on another side of the second support; and a second hinge connecting another side of the second support and a side of the cover and defining a second axis substantially parallel to the first axis, wherein the cover comprises a transparent material and a recess disposed on the side connected to the second hinge member.

8 Claims, 18 Drawing Sheets

(56)     References Cited

U.S. PATENT DOCUMENTS

|  |  |  |  |
|---|---|---|---|
| 9,720,455 | B2 | 8/2017 | Jang |
| 9,801,290 | B2* | 10/2017 | Ahn ..................... H05K 5/0217 |
| 9,940,862 | B2 | 4/2018 | Um |
| 10,008,135 | B2 | 6/2018 | Lim |
| 10,036,187 | B2 | 7/2018 | Cheah et al. |
| 10,041,282 | B2 | 8/2018 | Cheah et al. |
| 10,243,030 | B2 | 3/2019 | Wu |
| 10,296,052 | B1 | 5/2019 | Quinn et al. |
| 10,362,696 | B2 | 7/2019 | Ahn |
| 10,398,048 | B2 | 8/2019 | Jeon |
| 10,627,868 | B2 | 4/2020 | Fujimoto |
| 10,633,898 | B2 | 4/2020 | Cheah et al. |
| 10,912,205 | B2 | 2/2021 | Hirakata et al. |
| 11,327,532 | B2 | 5/2022 | Han |
| 11,639,623 | B2 | 5/2023 | Cheah et al. |
| 2008/0309640 | A1 | 12/2008 | Hong |
| 2010/0207888 | A1 | 8/2010 | Camiel |
| 2014/0218305 | A1 | 8/2014 | Beasley et al. |
| 2015/0277506 | A1 | 10/2015 | Cheah et al. |
| 2019/0258295 | A1* | 8/2019 | Fujimoto .................. G09F 9/00 |

FOREIGN PATENT DOCUMENTS

| | | | |
|---|---|---|---|
| CN | 104111702 | A | 10/2014 |
| CN | 203911991 | U | 10/2014 |
| CN | 209804146 | U | 12/2019 |
| JP | 2010181962 | A | 8/2010 |
| KR | 19990077436 | A | 10/1999 |
| KR | 1020080109292 | A | 12/2008 |
| KR | 1020110053265 | A | 5/2011 |
| KR | 1020120115629 | | 10/2012 |
| KR | 1020150099676 | A | 9/2015 |
| KR | 1020160074815 | A | 6/2016 |
| KR | 1020160087972 | A | 7/2016 |
| KR | 101646690 | B1 | 8/2016 |
| KR | 1020160114657 | A | 10/2016 |
| KR | 1020160120853 | A | 10/2016 |
| KR | 1020160141254 | A | 12/2016 |
| KR | 1020180114565 | A | 10/2018 |
| KR | 1020190037585 | A | 4/2019 |
| KR | 10-1999941 | | 7/2019 |
| KR | 2020-0007510 | | 1/2020 |
| KR | 1020200037727 | A | 4/2020 |

* cited by examiner

LA: LA_R, LA_G, LA_B

DISPLAY DEVICE

CROSS REFERENCE TO RELATED APPLICATION

This application is a Continuation of U.S. patent application Ser. No. 17/146,395, filed on Jan. 11, 2021, which claims priority from and the benefit of Korean Patent Application No. 10-2020-0046558, filed on Apr. 17, 2020, each of which is hereby incorporated by reference for all purposes as if fully set forth herein.

BACKGROUND

Field

Exemplary embodiments of the invention relate generally to a display device and, more particularly, to a display device that can protect a display module from external impact.

Discussion of the Background

A display device is a device that displays an image and includes a display panel such as a liquid crystal display panel or an organic light emitting display panel including organic light emitting diodes (OLED) or quantum dot electroluminescence (QD-EL) devices.

A mobile electronic device includes a display device to provide an image to a user. There is a growing proportion of mobile electronic devices having the same or smaller volume or thickness but a larger display screen than conventional ones. In addition, a foldable or bendable display device that can be folded and unfolded to provide a larger screen only when used is being developed.

The above information disclosed in this Background section is only for understanding of the background of the inventive concepts, and, therefore, it may contain information that does not constitute prior art.

SUMMARY

The thickness of a cover window on a foldable display panel should be minimized to ensure reliable folding. Applicant realized that a thin cover window can be easily damaged by a user's continuous touch such as typing or by external impact.

Foldable display devices constructed according to the principles and exemplary implementations of the invention are thin enough to be reliably folded and unfolded while at the same time protect the display module from external impact. For example, the foldable display devices provide for sufficient thinness to facilitate folding but also protect the display module from external impact Additional features of the inventive concepts will be set forth in the description which follows, and in part will be apparent from the description, or may be learned by practice of the inventive concepts.

According to one aspect of the invention, a display device includes: a display panel having an upper surface to display an image and a lower surface; a first support and a second support disposed on the lower surface of the display panel; a first hinge connecting a side of the first support and a side of the second support and defining a first axis; a cover disposed on another side of the second support; and a second hinge connecting another side of the second support and a side of the cover and defining a second axis substantially parallel to the first axis, wherein the cover comprises a transparent material and a recess disposed on the side connected to the second hinge member.

The first and second hinges may include first and second hinge members, respectively, and the second hinge member may include a shaft received in the second support member to define the second axis and a pair of rotatable couplers supported at either end of the shaft.

At least one of the pair of rotatable couplers may include coupling members or a joint and an extension formed integrally with a side of the body part.

The second support member may include a pair of first recessed parts disposed at both corners adjacent to the cover member, a second recessed part additionally recessed from a surface of each first recessed part, and a step part formed by each first recessed part and the second recessed part.

The extension may include an extension part configured to rotate around the second axis to be received in the second recessed part.

The second support member may include a projection extending between the pair of first recessed parts, the projection being accommodated in the recess of the cover member.

The cover may include a pair of attachment parts disposed with the recess interposed therebetween.

The cover may include a pair of connectors disposed at the pair of attachment parts, respectively.

The at least one of the connectors may include one or more adhesive members or a magnet.

The cover may include a cover member including a first substrate, a first buffer layer disposed on a surface of the first substrate, and a second buffer layer disposed on another surface of the first substrate.

The first buffer layer and the second buffer layer may include a polyurethane-based material.

The display panel may include a first non-folding area disposed on the first support, a second non-folding area disposed on the second support and a folding area disposed on the first hinge, and the cover may be rotatable around the second axis to overlap the second non-folding area in a thickness direction.

According to another aspect of the invention, a display device includes: a display panel having an upper surface to display an image and a lower surface; a first support and a second support disposed on the lower surface of the display panel; a first hinge connecting a side of the first support and a side of the second support and defining a first axis; and a cover having a generally U-shaped cross section defining an opening to receive an end of the second support and an end of the display panel detachably insertable into the opening; wherein the cover comprises a first substantially flat part disposed on the upper surface of the display panel, a second substantially flat part disposed on a lower surface of the second support, and an intermediate portion connecting the first substantially flat part and the second substantially flat part.

The first substantially flat part may include a pair of keyholes.

The cover may include a cover member including a transparent display panel, and the second substantially flat part may include an electrode pad part electrically connected to the transparent display panel.

The distance between the first substantially flat part and the second substantially flat part in a thickness direction may be greater than a thickness of the second support.

A first buffer may be disposed on a surface of the first substantially flat part facing the upper surface of the display panel; and a second buffer may be disposed on a surface of the second substantially flat part facing the lower surface of the second support.

According to a further aspect of the invention, a display device includes: a display panel having an upper surface to display an image and a lower surface; a first support and a second support disposed on the lower surface of the display panel; a first hinge connecting the first support and the second support and defining a first axis; a cover disposed on a side of the first support; and a second hinge connecting the first support and the cover and defining a second axis intersecting the first axis.

The cover may be detachably coupled to the first support.

The cover may include a cover member including a transparent display layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
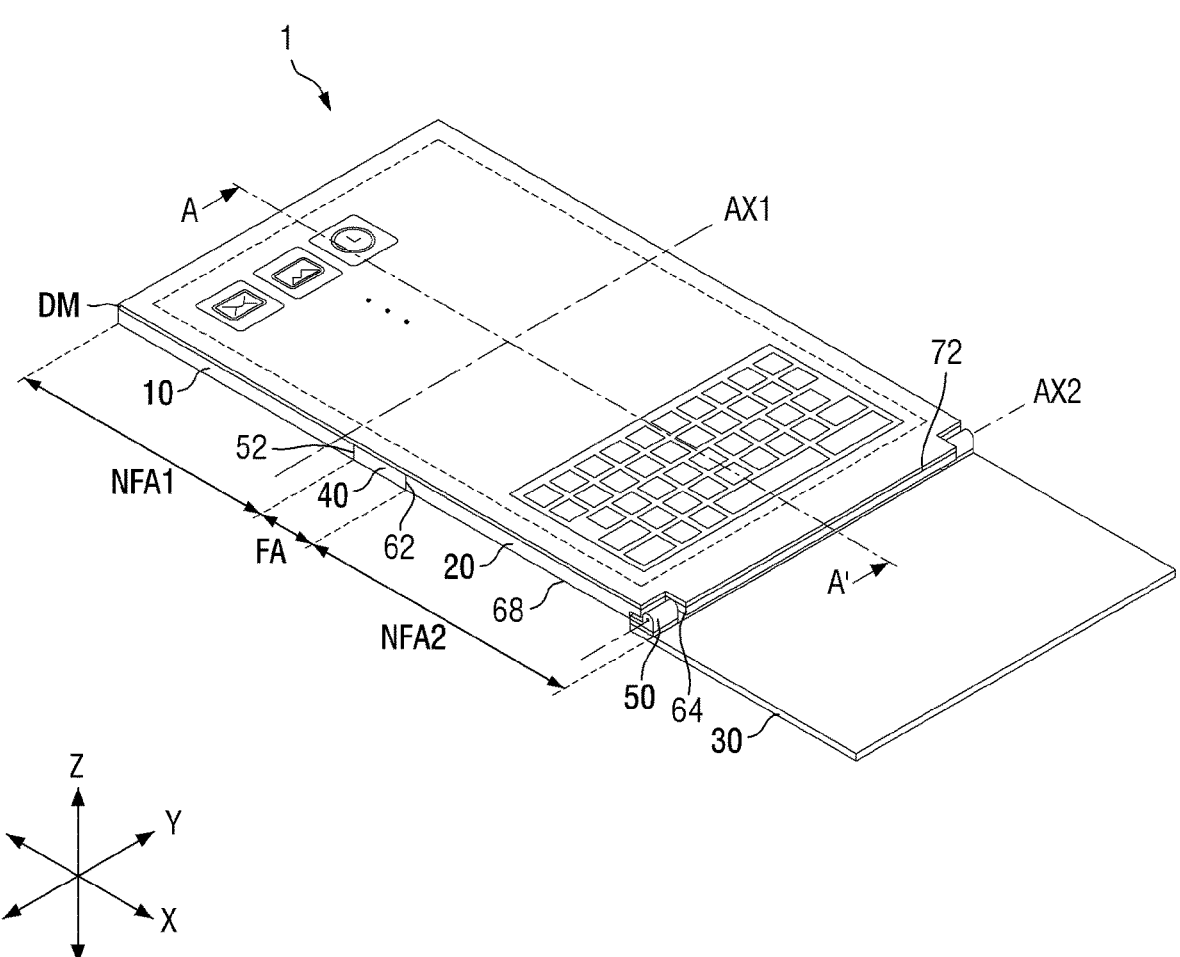
FIG. 1 is a perspective view of an exemplary embodiment of a display device constructed according to the principles of the invention in an unfolded position.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
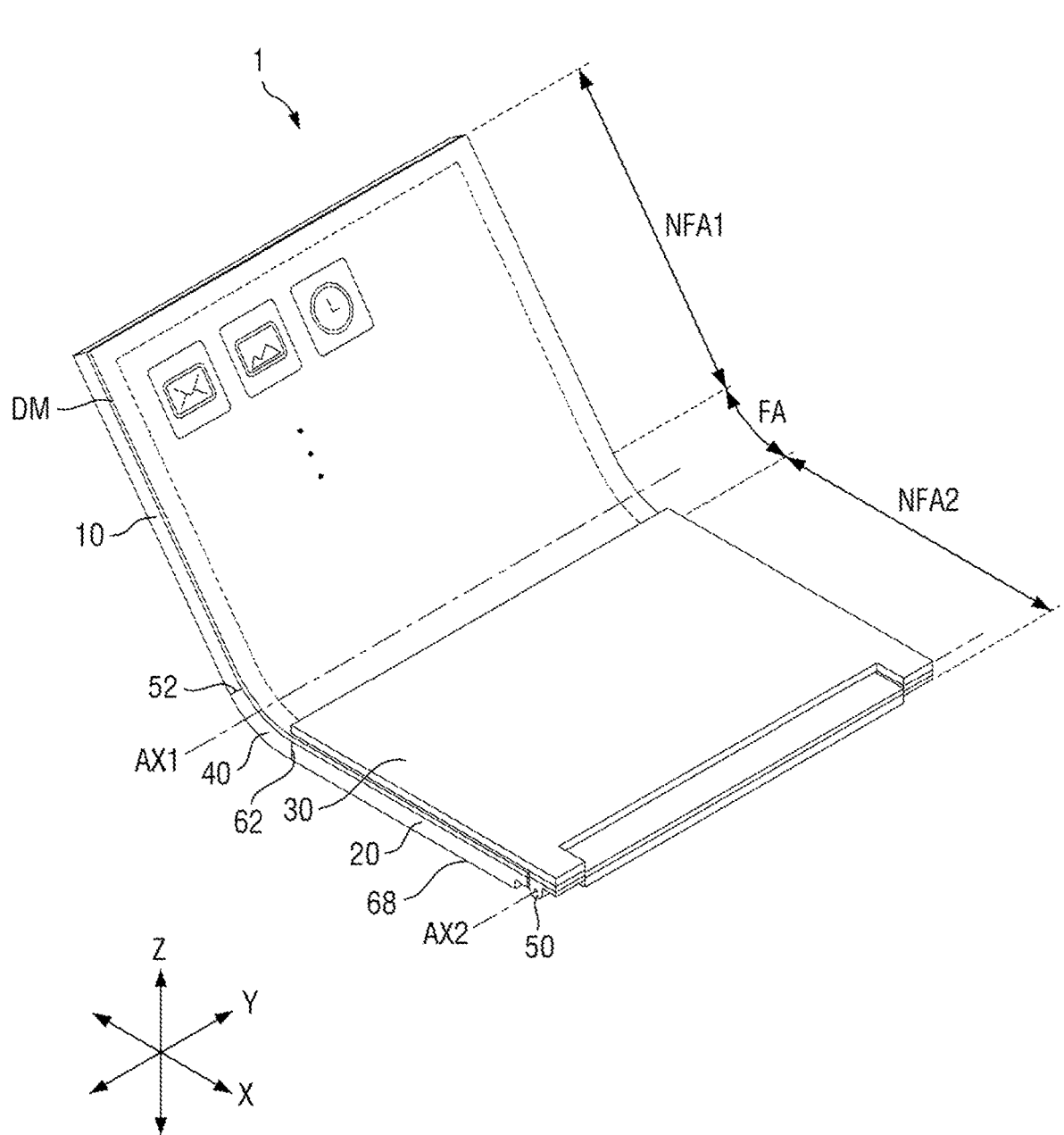
FIG. 2 is a perspective view of the display device of FIG. 1 in a first folded position.
Figure 3:
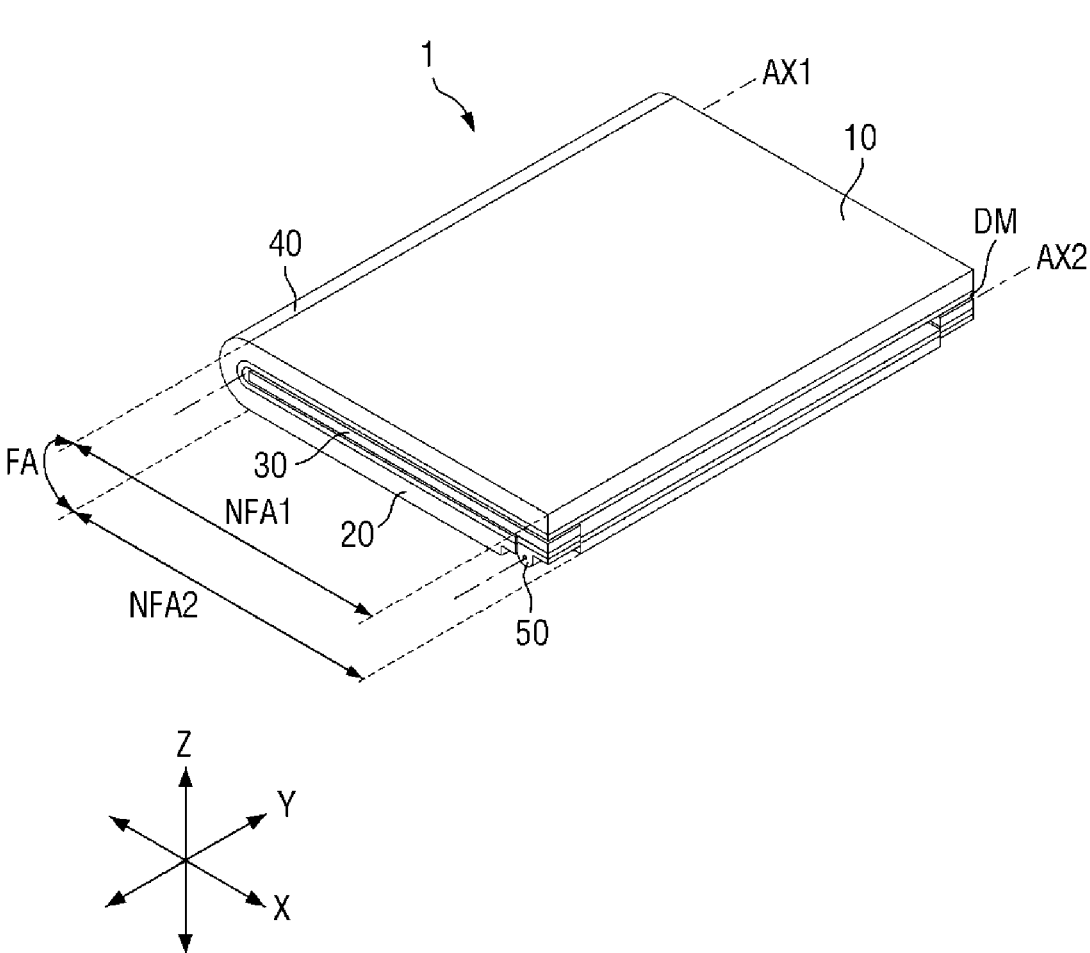
FIG. 3 is a perspective view of the display device of FIG. 1 in a second folded position.

FIG. 1 is a perspective view of an exemplary embodiment of a display device constructed according to the principles of the invention in an unfolded position. FIG. 2 is a perspective view of the display device of FIG. 1 in a first folded position. FIG. 3 is a perspective view of the display device of FIG. 1 in a second folded position.

Display device 1 according to some exemplary embodiments may include various devices that display a screen or an image. For example, examples of the display device 1 may include, but are not limited to, smartphones, mobile phones, tablet personal computers (PCs), personal digital assistants (PDAs), portable multimedia players (PMPs), televisions, game machines, wristwatch-type electronic devices, head mounted displays, monitors of PCs, notebook computers, car navigation systems, car dashboards, digital cameras, camcorders, external billboards, electronic boards, various medical devices, various examination devices, various home appliances including a display part DPA, such as refrigerators and washing machines, and Internet of things (IoT) devices or the like.

Referring to FIGS. 1 through 3, the display device 1 may have a generally rectangular shape that is longer in the first direction X in plan view. In some exemplary embodiments, the display device 1 may have both long sides in the first direction X and both short sides in the second direction Y intersecting the first direction X in plan view. However, the exemplary embodiments are not limited thereto, and the display device 1 may have various shapes.

The display device 1 may be a foldable device. The display device 1 may be folded or unfolded. Here, 'folded' may include 'bent.' Specifically, the display device 1 may be bent so that a part overlaps another part or is inclined to another part, or the whole of the display device 1 may be spread flat. In some exemplary embodiments, the display device 1 may be folded so that an angle between a part and another part of the display device 1 is greater than about 0 degrees and less than about 180 degrees or may be unfolded so that the angle between the part and the another part of the display device 1 is about 180 degrees.

The display device 1 includes a display module DM, a first support in the form a first support member 10, a second support in the form of second support member 20, a cover in the form of cover member 30, a first hinge in the form of first hinge member 40, and a second hinge in the form of second hinge member 50.

The display module DM may have a generally rectangular shape that is long in the first direction X in plan view. The display module DM may be disposed over the first support member 10 and the second support member 20 to be described below. Each corner of the display module DM adjacent to the cover member 30 to be described below may be recessed in a generally 'L' shape.

The display module DM has flexibility. The display module DM may be folded or unfolded along a first axis AX1 of the second direction Y as the first support member 10 and the second support member 20 to be described below are folded or unfolded. The detailed folding or unfolding operation of the display device 1 will be described below with reference to FIGS. 2 and 3.

The display module DM may include a folding area FA, a first non-folding area NFA1, and a second non-folding area NFA2. The folding area FA is the area that is folded or unfolded as the first support member 10 and the second support member 20 to be described below are folded or unfolded. The first non-folding area NFA1 and the second non-folding area NFA2 may be areas that are neither folded nor unfolded. The folding area FA may be folded to have a predetermined radius of curvature with respect to the first axis AX1 to be described below.

The first non-folding area NFA1 and the second non-folding area NFA2 may be arranged in the first direction X, and the folding area FA may be disposed between the first non-folding area NFA1 and the second non-folding area NFA2. The folding area FA, the first non-folding area NFA1, and the second non-folding area NFA2 may be generally rectangular in plan view. The first non-folding area NFA1 and the second non-folding area NFA2 may be substantially flat in some exemplary embodiments and larger in size than the folding area FA. The folding area FA may have a generally rectangular shape that is long in the second direction Y in plan view.

In some exemplary embodiments, the display module DM includes one folding area FA and two non-folding areas NFA1 and NFA2, but the number of folding areas FA and the number of non-folding areas NFA1 and NFA2 are not limited thereto.

The first support member 10, the second support member 20, and the cover member 30 may be sequentially arranged in the first direction X in plan view. The first support member 10, the second support member 20, and the cover member 30 may be substantially rectangular in plan view. As will be described below, the first support member 10, the second support member 20, and the cover member 30 may have different shapes. The first support member 10, the second support member 20, and the cover member 30 may have substantially the same size. In some exemplary embodiments, the first support member 10, the second support member 20, and/or the cover member 30 may have different sizes. For example, the size of the cover member 30 may be equal to or smaller than the size of the first support member 10 and/or the second support member 20. In detail, the first support member 10, the second support member 20 and/or the cover member 30 may have the same width in the second direction Y but may have different widths in the first direction X.

The first support member 10 and the second support member 20 are disposed separately from each other on a lower surface of the display module DM. The first support member 10 and the second support member 20 may be disposed substantially symmetrically with respect to the folding area FA of the display module DM or the first axis AX1. In detail, the first support member 10 may be disposed at the first non-folding area NFA1 of the display module DM, and the second support member 20 may be disposed at the second non-folding area NFA2 of the display module DM.

The first hinge member 40 connects a side 52 of the first support member 10 and a side 62 of the second support member 20. The first hinge member 40 defines the first axis AX1. The first support member 10 and the second support member 20 may be connected by the first hinge member 40 such that they can rotate around the first axis AX1. The first axis AX1 may include at least one rotation axis or folding axis. The first axis AX1 may be a physical axis disposed in the first hinge member 40 or an imaginary axis disposed outside the first hinge member 40. The first hinge member 40 may extend in the second direction Y between the first support member 10 and the second support member 20. In some exemplary embodiments, the first hinge member 40 may include a stretchable hinge that is compressed or stretched according to folding or unfolding of the display device 1. In some exemplary embodiments, the first hinge member 40 may include a mechanical hinge that includes at least one shaft and at least one rotating member rotating around the shaft, as described for the second hinge member 50, as described below. Alternatively, the first hinge member 40 may have a different hinge structure from the second hinge member 50. The first hinge member 40 may include a friction hinge that can maintain an angle between the first support member 10 and the second support member 20.

The second hinge member 50 connects the other side 64 of the second support member 20 and a side of the cover member 30. The second hinge member 50 defines a second axis AX2. The second support member 20 and the cover member 30 may be connected by the second hinge member 50 such that they can rotate around the second axis AX2. The second axis AX2 may include at least one rotation axis. In some exemplary embodiments, the second hinge member 50 may include a mechanical hinge. The second hinge member 50 may include a friction hinge that can maintain an angle between the second support member 20 and the cover member 30. The coupling relationship between the second hinge member 50 and each of the second support member 20 and the cover member 30 will be described in detail below with reference to FIGS. 6 through 8.

Referring to FIGS. 1 through 3, the display device 1 may have an unfolded position and one or more folded positions. The folded positions may include the first folded position and the second folded position. Referring to FIG. 1, the unfolded position may be a position in which the first support member 10, the second support member 20, and the cover member 30 are substantially extended and flat to lie side by side in substantially the same plane. For example, an angle between the first support member 10 and the second support member 20 and an angle between the second support member 20 and the cover member 30 may each be about 180 degrees.

Referring to FIG. 2, the first folded position may be a position in which the cover member 30 overlaps the second support member 20 in the thickness direction. Referring to FIGS. 1 and 2, the cover member 30 may rotate around the second axis AX2 in a counterclockwise direction to overlap the second support member 20 in the thickness direction. Here, the angle between the second support member 20 and the cover member 30 may be about 0 or about 360 degrees.

In the first folded position, the cover member 30 may cover a part of a front surface of the display module DM. In detail, the cover member 30 may cover a part of the front surface of the display module DM disposed in the second non-folding area NFA2 of the display module DM.

The first folded position may include a position in which the first support member 10 is folded or bent to form a predetermined angle with the second support member 20. Accordingly, the display module DM disposed on the first support member 10 and the second support member 20 may also be folded or bent to have the predetermined angle. For example, the predetermined angle may be greater than about 0 degrees and less than about 180 degrees. For another example, the predetermined angle may be greater than about 90 degrees and less than about 150 degrees.

In the first folded position, the cover member 30 may protect the second non-folding area NFA2 of the display module DM. For example, when an image of a keyboard is displayed on the second non-folding area NFA2 of the display module DM, repetitive impact may be applied to this area by a user's touch input. Here, the cover member 30 may cover a part of the display module DM to protect the display module DM.

Referring to FIG. 3, the second folded position may be a position in which the first support member 10, the second support member 20, and the cover member 30 overlap in the thickness direction. Referring to FIGS. 2 and 3, the first support member 10 may rotate around the first axis AX1 in a clockwise direction to overlap the second support member 20 and the cover member 30 in the thickness direction. Here, the angle between the second support member 20 and the cover member 30 and the angle between the first support member 10 and the second support member 20 may be about 0 or about 360 degrees.

As the first support member 10 and the second support member 20 overlap in the thickness direction, the display module DM may be in-folded so that a part and another part of the front surface of the display module DM face each other. In the second folded position, the cover member 30 may be disposed between a part of the front surface of the display module DM disposed in the first non-folding area NFA1 of the display module DM and another part of the front surface of the display module DM disposed in the second non-folding area NFA2. In some exemplary embodiments, in the second folded position, the cover member 30 may contact a part of the front surface disposed in the second non-folding area NFA2 of the display module DM and another part of the front surface disposed in the first non-folding area NFA1. In some exemplary embodiments, in the second folded position, the cover member 30 may be spaced apart from a part of the front surface disposed in the first non-folding area NFA1 of the display module DM. The display module DM will now be described in detail with reference to FIGS. 4 and 5.

Figure 4:
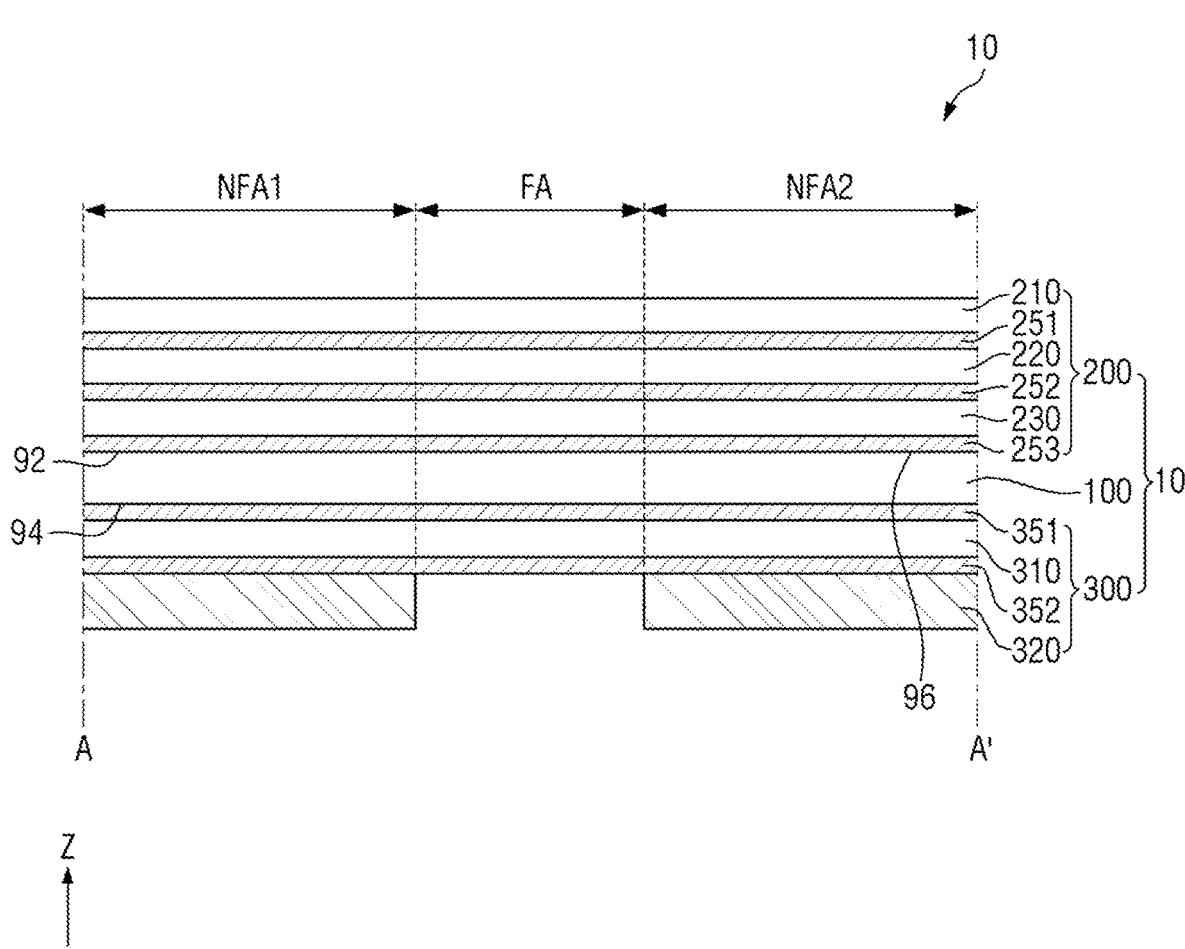
FIG. 4 is a cross-sectional view of an exemplary embodiment of a display module taken along line A-A' of FIG. 1.
Figure 5:
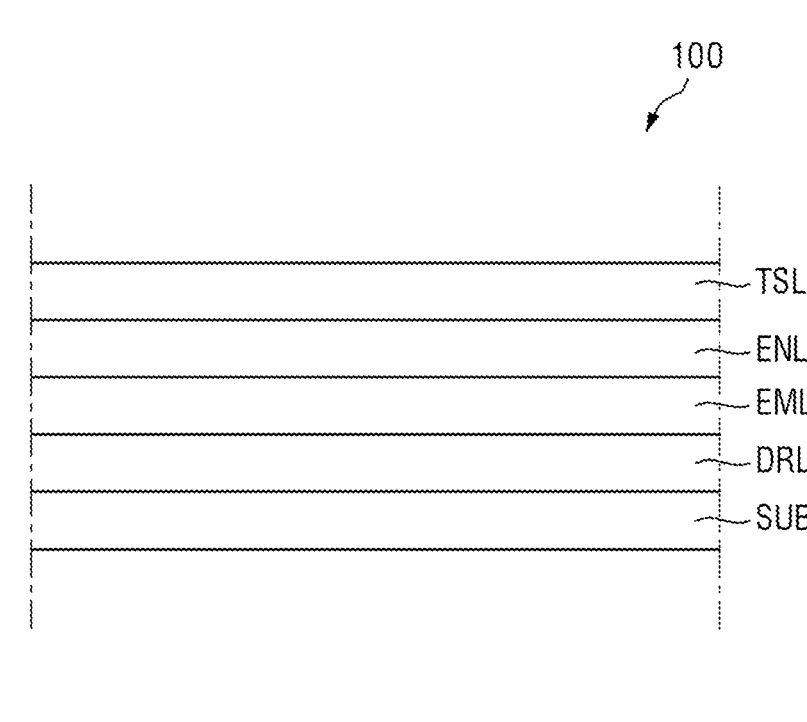
FIG. 5 is a cross-sectional view of an exemplary embodiment of a display panel of FIG. 4.

FIG. 4 is a cross-sectional view of an exemplary embodiment of a display module taken along line A-A' of FIG. 1. FIG. 5 is a cross-sectional view of an exemplary embodiment of a display panel of FIG. 4.

Referring to FIG. 4, the display module DM may include the display panel 100, a front-stack structure 200, and a back-stack structure 300. The display module DM may include the display panel 100 with the front-stack structure 200 disposed on an upper surface 92 of the display panel 100, and the back-stack structure 300 disposed on a lower surface 94 the display panel 100. The display panel 100 may also have an end 96. As described herein, 'front' may be a direction in which the display panel 100 displays a screen, and 'back' may be a direction opposite to front.

The display panel 100 is a panel that displays a screen or an image. Examples of the display panel 100 may include self-luminous display panels such as organic light emitting display panels, inorganic electroluminescent (EL) display panels, quantum dot light emitting display (QED) panels, micro-light emitting diode (LED) display panels, nano-LED display panels, plasma display panels (PDPs), field emission display (FED) panels and cathode ray tube (CRT) display panels as well as light receiving display panels such as liquid crystal display (LCD) panels and electrophoretic display (EPD) panels. An organic light emitting display panel will hereinafter be described as an example of the display panel 100, and the organic light emitting display panel applied to some exemplary embodiments will be simply abbreviated to the display panel 100 unless special distinction is required. However, the exemplary embodiments are not limited to the organic light emitting display panel, and other display panels listed above or known in the art are also applicable.

The display panel 100 may further include a touch member. The touch member may be provided as a panel or film separate from the display panel 100 and attached onto the display panel 100. However, the touch member may also be provided in the form of a touch layer inside the display panel 100. In the following exemplary embodiment, a case where the touch member is provided and included in the display panel 100 will be described, but the exemplary embodiments are not limited thereto.

Referring to FIGS. 4 and 5, the display panel 100 may include a substrate SUB, a circuit driving layer DRL disposed on the substrate SUB, a light emitting layer EML disposed on the circuit driving layer DRL, an encapsulating layer ENL disposed on the light emitting layer EML, and a touch layer TSL disposed on the encapsulating layer ENL.

The substrate SUB may be a flexible substrate including a flexible polymer material such as a polyimide. Accordingly, the display panel 100 can be generally curved, bent, folded, or rolled. In some exemplary embodiments, the substrate SUB may include a plurality of sub-substrates overlapping each other in the thickness direction with a barrier layer interposed between them. In this case, each sub-substrate may be a flexible substrate.

The circuit driving layer DRL may be disposed on the substrate SUB. The circuit driving layer DRL may include a circuit for driving the light emitting layer EML of each pixel. The circuit driving layer DRL may include a plurality of thin-film transistors.

The light emitting layer EML may be disposed on the circuit driving layer DRL. The light emitting layer EML may include an organic light emitting layer. The light emitting layer EML may emit light of various luminance levels according to a driving signal received from the circuit driving layer DRL.

The encapsulating layer ENL may be disposed on the light emitting layer EML. The encapsulating layer ENL may include an inorganic layer or a laminate of an inorganic layer and an organic layer.

The touch layer TSL may be disposed on the encapsulating layer ENL. The touch layer TSL is a layer for recognizing a touch input and may function as the touch member. The touch layer TSL may include a plurality of sensing regions and sensing electrodes.

Referring again to FIG. 4, the front-stack structure 200 is disposed on the upper surface 92 of the display panel 100. The front-stack structure 200 may include a polarizing member 230, a cover window 220, and a cover window protective layer 210 stacked sequentially in the forward direction from the display panel 100.

The polarizing member 230 polarizes light that passes therethrough. The polarizing member 230 may reduce reflection of external light. In some exemplary embodiments, the polarizing member 230 may be a polarizing film. The polarizing film may include a polarizing layer and protective substrates sandwiching the polarizing layer from above and under the polarizing layer. The polarizing layer may include a polyvinyl alcohol film. The polarizing layer may be stretched in one direction. The stretching direction of the polarizing layer may be an absorption axis, and a direction generally perpendicular to the stretching direction may be a transmission axis. The protective substrates may be disposed on a surface and the other surface of the polarizing layer, respectively. The protective substrates may be made of, but not limited to, a cellulose resin, such as a triacetyl cellulose, or a polyester resin.

The cover window 220 may be disposed in front of the polarizing member 230. The cover window 220 protects the display panel 100. The cover window 220 may be made of a transparent material. The cover window 220 may be made of, e.g., a glass or a plastic. When the cover window 220 includes a glass, the glass may be an ultra-thin glass (UTG)

or a thin-film glass. Because the UTG or the thin-film glass has flexible properties, it can be curved, bent, folded, or rolled. The glass may have a thickness of, e.g., about 10 to about 300 µm, specifically, about 30 to about 80 µm, or about 50 µm. The glass of the cover window 220 may include a soda lime glass, an alkali aluminosilicate glass, a borosilicate glass, or a lithium aluminosilicate glass. The glass of the cover window 220 may include chemically or thermally tempered glass to have strong strength. The chemical tempering may be achieved through an ion exchange process performed in alkali salts. The ion exchange process may be performed two or more times.

When the cover window 220 includes a plastic, it may better exhibit flexible properties such as folding. Examples of the plastic applicable to the cover window 220 may include, but are not limited to, a polyimide, a polyacrylate, a polymethyl methacrylate (PMMA), a polycarbonate (PC), a polyethylene naphthalate (PEN), a polyvinylidene chloride, a polyvinylidene difluoride (PVDF), a polystyrene, an ethylene vinylalcohol copolymer, a polyethersulphone (PES), a polyetherimide (PEI), a polyphenylene sulfide (PPS), a polyallylate, a triacetyl cellulose (TAC), and a cellulose acetate propionate (CAP). The plastic cover window 220 may include one or more of the plastic materials listed above.

The cover window protective layer 210 may be disposed in front of the cover window 220. The cover window protective layer 210 may perform at least one of shatter prevention, shock absorption, dent prevention, fingerprint prevention, and anti-glare functions for the cover window 220. The cover window protective layer 210 may include a transparent polymer film. The transparent polymer film may include at least one of a polyethylene terephthalate (PET), a polyethylene naphthalate (PEN), a polyethersulfone (PES), a polyimide (PI), a polyacrylate (PAR), a polycarbonate (PC), a polymethyl methacrylate (PMMA), and a cycloolefin copolymer (COC).

The front-stack structure 200 may include front bonding members 251 through 253 which bond adjacent stacked members together. For example, a first bonding member 251 may be disposed between the cover window 220 and the cover window protective layer 210 to bond them together, a second bonding member 252 may be disposed between the cover window 220 and the polarizing member 230 to bond them together, and a third bonding member 253 may be disposed between the polarizing member 230 and the display panel 100 to bond them together. That is, the front bonding members 251 through 253 are members that bond layers to a surface of the display panel 100. The first bonding member 251 may be a protective layer bonding member for bonding the cover window protective layer 210, the second bonding member 252 may be a window bonding member for bonding the cover window 220, and the third bonding member 253 may be a polarizer bonding member for bonding the polarizing member 230. The front bonding members 251 through 253 may all be optically transparent.

The back-stack structure 300 is disposed on the lower surface 94 of the display panel 100. The back-stack structure 300 may include a polymer film layer 310 and a heat dissipation member 320 stacked sequentially in the backward direction from the display panel 100.

The polymer film layer 310 may include a polymer film. The polymer film layer 310 may include, for example, a polyimide (PI), a polyethylene terephthalate (PET), a polycarbonate (PC), a polyethylene (PE), a polypropylene (PP), a polysulfone (PSF), a polymethyl methacrylate (PMMA), a triacetyl cellulose (TAC), or a cyclo olefin polymer (COP).

The polymer film layer 310 may include a functional layer on at least one surface. The functional layer may include, for example, a light absorbing layer. The light absorbing layer may include a light absorbing material such as a black pigment or a dye. The light absorbing layer may be black ink and formed on the polymer film by coating or printing.

The heat dissipation member 320 may be disposed behind the polymer film layer 310. The heat dissipation member 320 dissipates heat generated from the display panel 100 or other components of the display device 1. The heat dissipation member 320 may be a heat dissipation sheet including a graphite or carbon nanotubes. In some exemplary embodiments, the heat dissipation member 320 may be divided by the first axis AX1 as illustrated in FIGS. 2 and 3 to facilitate folding of the display device 1. In some exemplary embodiments, the heat dissipation member 320 may remain undivided.

The back-stack structure 300 may include back bonding members 351 and 352 which bond adjacent stacked members together. For example, a fourth bonding member 351 may be disposed between the display panel 100 and the polymer film layer 310 to bond them together, and a fifth bonding member 352 may be disposed between the polymer film layer 310 and the heat dissipation member 320 to bond them together. In some exemplary embodiments, the back-stack structure 300 may further include a buffer member. The buffer member may be disposed, for example, between the polymer film layer 310 and the heat dissipation member 320. The coupling relationship between the second support member 20 and the cover member 30 will now be described in detail with reference to FIG. 6.

Figure 6:
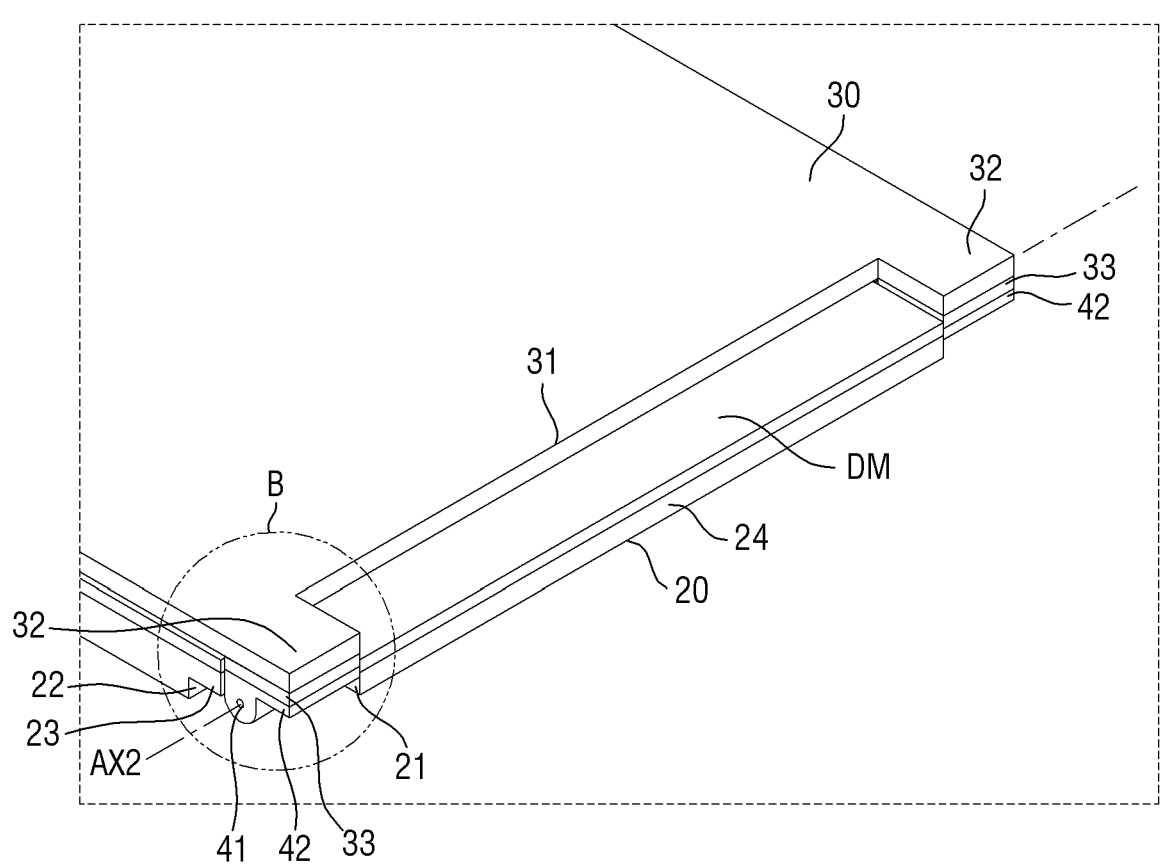
FIG. 6 is an enlarged perspective view of an exemplary embodiment of a second hinge member of the display device of FIG. 1
Figure 6:
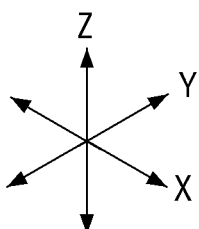
Figure 7:
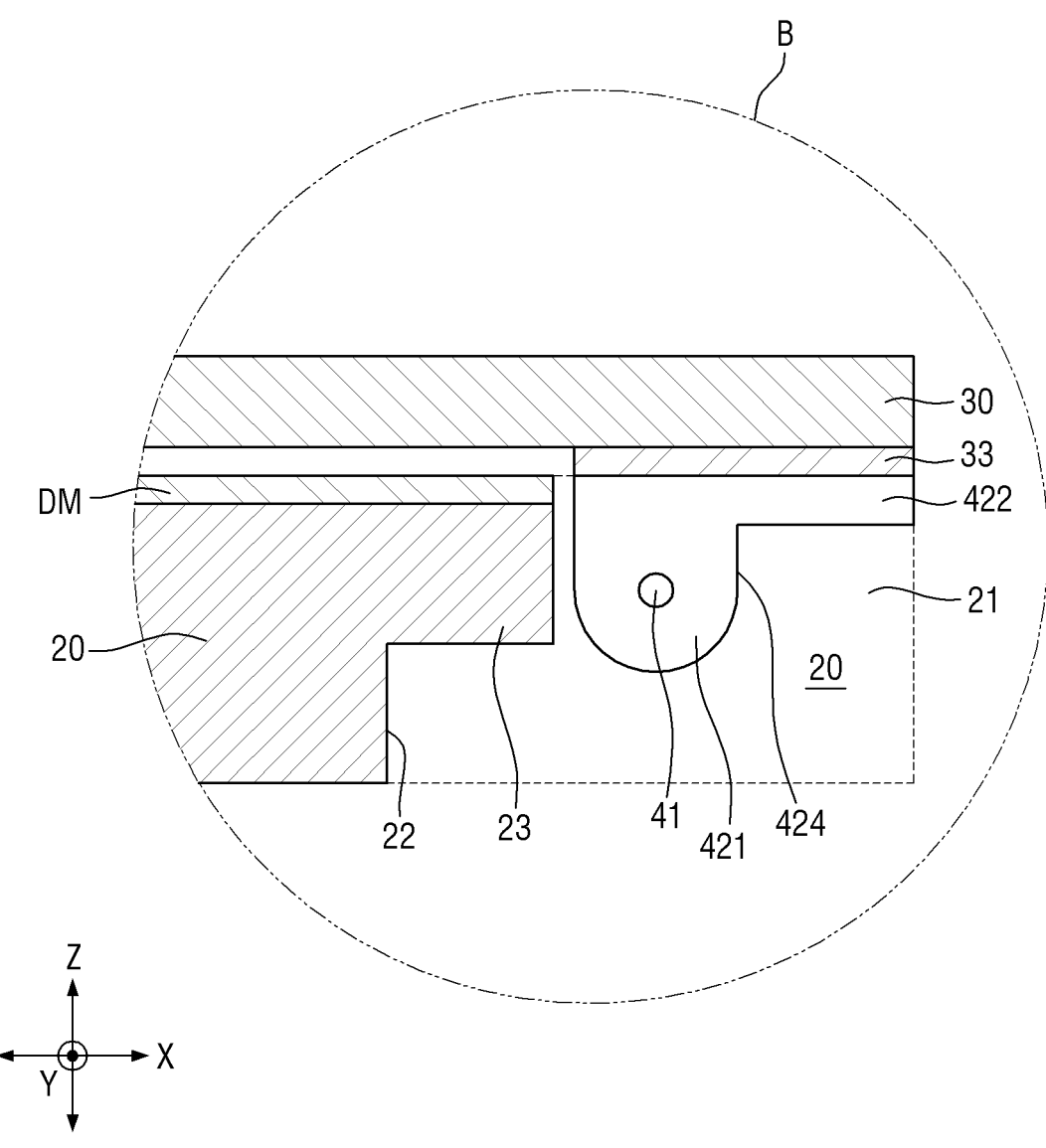
FIGS. 7 and 8 are side views of an exemplary embodiment of part 'B' of FIG. 6.
Figure 8:
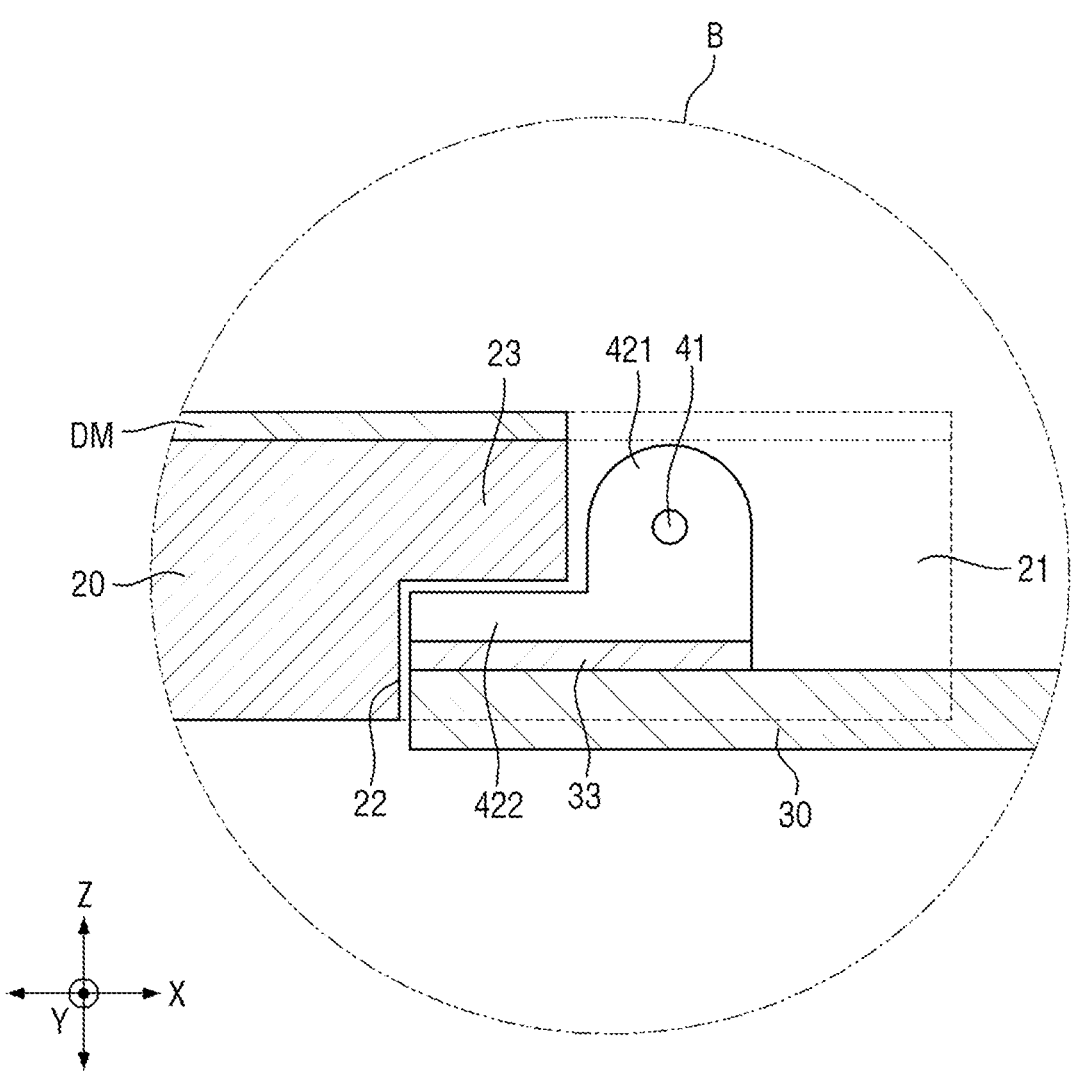

FIG. 6 is an enlarged perspective view of an exemplary embodiment of a second hinge member of the display device of FIG. 1. FIGS. 7 and 8 are side views of an exemplary embodiment of part 'B' of FIG. 6.

Referring to FIGS. 1 through 3 and 6 through 8, as described above, the second support member 20 and the cover member 30 may be connected by the second hinge member 50 such that they can rotate around the second axis AX2. In some exemplary embodiments, the cover member 30 may be non-removably coupled to the second hinge member 50. In some exemplary embodiments, the cover member 30 may be detachably coupled to the second hinge member 50.

Referring to FIGS. 6 through 8, the second support member 20 may include a pair of first recessed parts 21, a pair of second recessed parts 22, a step part 23, and a protruding part 24. The pair of first recessed parts 21 may be respectively disposed in both corner areas of a side on which the second hinge member 50 is disposed. The pair of first recessed parts 21 may be disposed such that both corner areas of a side of the second support member 20 are recessed in a generally 'L' shape in plan view. The pair of first recessed parts 21 may respectively accommodate a pair of couplers in the form of coupling members 42 of the second hinge member 50 to be described below.

The pair of second recessed parts 22 may be disposed in the pair of first recessed parts 21. A second recessed part 22 may be formed by additionally recessing, in the first direction X, a part of a surface of a first recessed part 21 extending in the first direction X. The first direction X may be a left direction in FIG. 6. Accordingly, the step part 23 may be formed in each corner area of a side of the second support member 20 by the first recessed part 21 and the second recessed part 22. The pair of second recessed parts 22 may respectively accommodate extension parts 422 of the pair of coupling members 42 to be described below.

The protruding part 24 is disposed between the pair of first recessed parts 21 and/or the pair of second recessed parts 22. The protruding part 24 may be accommodated in a recess in the form of notch part 31 of the cover member 30, which will be described below, during rotation of the cover member 30. The protruding part 24 may be penetrated by a shaft 41 of the second hinge member 50 to be described below. The cover member 30 may include the notch part 31 and a pair of attachment parts 32. The cover member 30 may further include a pair of connectors in the form adhesive members 33.

The notch part 31 is disposed on a side of the cover member 30 adjacent to the second axis AX2. The notch part 31 accommodates the protruding part 24 of the second support member 20 to prevent interference between the second support member 20 and the cover member 30 during rotation of the cover member 30. The pair of attachment parts 32 are disposed with the notch part 31 interposed between them. The pair of attachment parts 32 may be respectively connected to the pair of coupling members 42 of the second hinge member 50 to be described below.

The pair of adhesive members 33 may be disposed at the pair of attachment parts 32, respectively. The adhesive members 33 may be disposed between the attachment parts 32 and the coupling members 42 to be described below. The adhesive members 33 bond the attachment parts 32 and the coupling members 42. In some exemplary embodiments, the cover member 30 may be strongly bonded to the coupling members 42 by the adhesive members 33. In some exemplary embodiments, the cover member 30 may be detachably coupled to the second hinge member 50. For example, the cover member 30 may be coupled to the second hinge member 50 by a magnetic force. Specifically, the coupling members 42 to be described below may include a metal, and the pair of adhesive members 33 may include a magnet.

The second hinge member 50 may include the shaft 41 and the pair of coupling members 42. The shaft 41 has a generally rod shape that is long in the second direction Y and provides the second axis AX2. The shaft 41 may penetrate the protruding part 24 of the second support member 20. The pair of coupling members 42 are disposed at both ends of the shaft 41. The pair of coupling members 42 support and couple the shaft 41 and the cover member 30 together. Each of the pair of coupling members 42 may include a body part 421 and the extension part 422. The body part 421 may have a generally cylindrical shape forming a hollow through which the shaft 41 passes.

The extension part 422 protrudes from a side 424 of the body part 421. The extension part 422 may have a predetermined length to extend substantially parallel to an upper surface of the cover member 30. The extension part 422 may provide the area for providing a sufficient coupling force to couple the second support member 20 and the second hinge member 50. As illustrated in FIGS. 7 and 8, the extension part 422 may be accommodated in each first recessed part 21 in the first folded position and accommodated in each second recessed part 22 in the unfolded position.

In some exemplary embodiments, the second hinge member 50 may be disposed in the cover member 30. Specifically, the shaft 41 may penetrate the cover member 30, and a part of the second support member 20 may be coupled to the pair of coupling members 42 disposed at both ends of the shaft 41.

Referring to FIGS. 1 and 6 through 8, since the second hinge member 50 is provided on a side of the second support member 20 by the first recessed parts 21, the second recessed parts 22 and the protruding part 24, a non-display area, e.g., a bezel area of the display module DM can be efficiently used.

Referring to FIGS. 1 through 3 and 6 through 8, the cover member 30 may be made of a transparent material. Accordingly, in the first folded position in which the cover member 30 overlaps the second support member 20 and a part of the display module DM on the second support member 20 in the thickness direction, an image displayed on the second non-folding area NFA2 may be visible through the cover member 30. The cover member 30 may include a plurality of layers made of a light transmitting material. The stacked structure of the cover member 30 will now be described with reference to FIG. 9.

Figure 9:
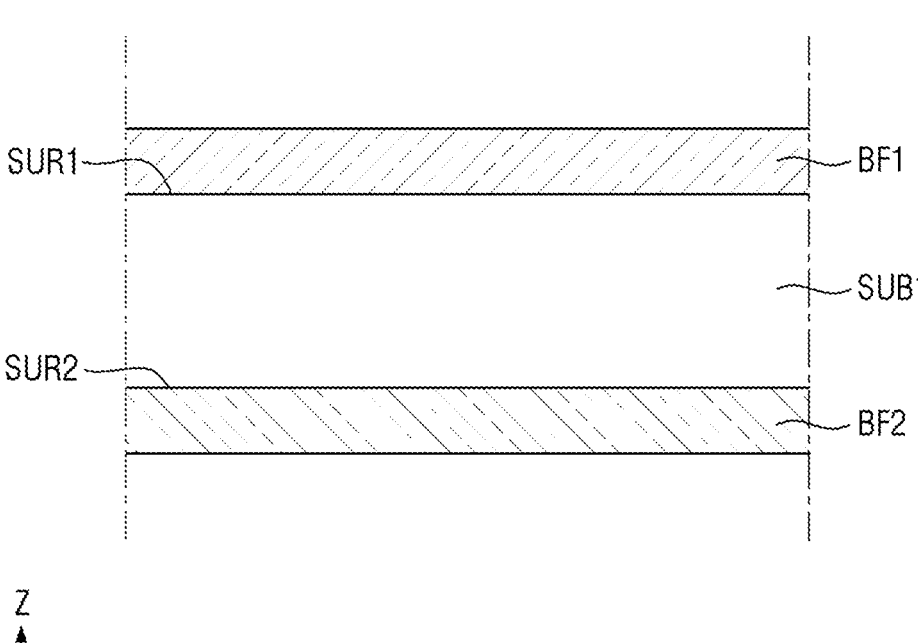
FIG. 9 is a cross-sectional view of an exemplary embodiment of a cover member of the display device of FIG. 1.

FIG. 9 is a cross-sectional view of an exemplary embodiment of a cover member of the display device of FIG. 1.

Referring to FIG. 9, the cover member 30 may include a first substrate SUB1, a first buffer member BF1 on one surface SUR1 of the first substrate SUB1 and a second buffer member BF2 on the other surface SUR2 of the first substrate SUB1. The first buffer member BF1, the first substrate SUB1, and the second buffer member BF2 may be made of a transparent material.

The first substrate SUB1 may be made of a transparent glass or a plastic material having a predetermined strength. For example, the first substrate SUB1 may be made of tempered glass such as an alumina silicate or a soda lime glass. For another example, the first substrate SUB1 may be made of an industrial plastic material such as a polyamide, a polyacetal, a polycarbonate, a polyethylene terephthalate, or a denatured polyphenylene oxide.

The first buffer member BF1 and the second buffer member BF2 may be made of a transparent elastic material. For example, the first buffer member BF1 and the second buffer member BF2 may be made of a rubber or a polyurethane-based material. The first buffer member BF1 and the second buffer member BF2 may absorb external shock and prevent damage due to interference between members.

Figure 10:
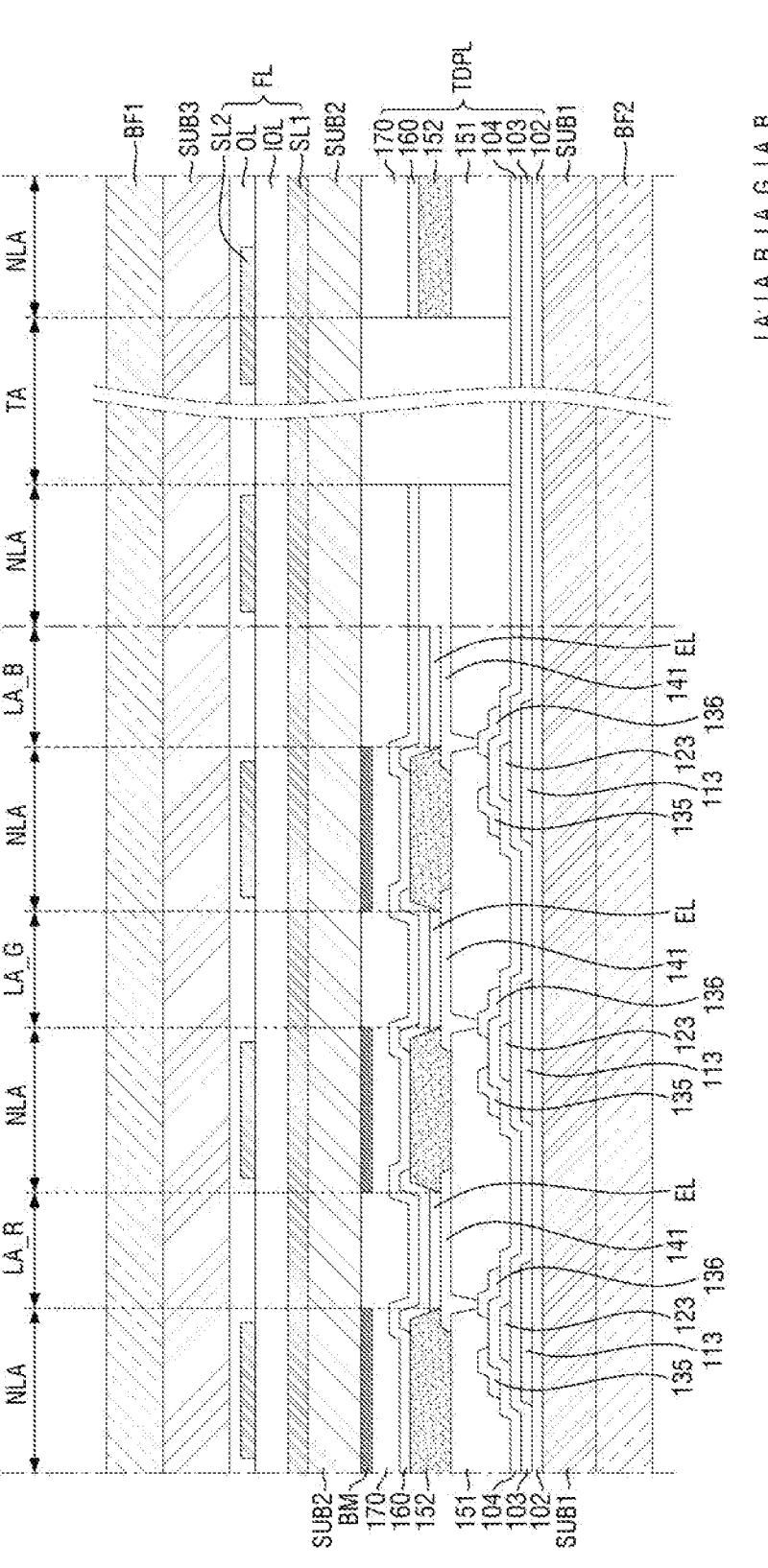
FIG. 10 is a cross-sectional view of another exemplary embodiment of a cover member of a display device constructed according to the principles of the invention.

FIG. 10 is a cross-sectional view of another exemplary embodiment of a cover member of a display device constructed according to the principles of the invention.

The cover member 30a of FIG. 10 is different from the cover member 30 of FIG. 9 in that it further includes a second substrate SUB2, a third substrate SUB3, a functional layer FL, and a transparent display layer TDPL. Referring to FIGS. 1 through 8 and 10, the cover member 30a may have substantially the same shape and arrangement as the cover member 30 of FIGS. 1 through 8.

The cover member 30a may include a second buffer member BF2, a first substrate SUB1 disposed on the second buffer member BF2, the transparent display layer TDPL disposed on the first substrate SUB1, the second substrate SUB2 disposed on the transparent display layer TDPL, the functional layer FL disposed on the second substrate SUB2, the third substrate SUB3 disposed on the functional layer FL, and a first buffer member BF1 disposed on the third substrate SUB3.

The second substrate SUB2 and the third substrate SUB3 may be made of a transparent glass or a plastic material having a predetermined strength. For example, the second substrate SUB2 and the third substrate SUB3 may be made of a tempered glass such as an alumina silicate or a soda lime glass. For another example, the second substrate SUB2 and the third substrate SUB3 may be made of an industrial plastic material such as a polyamide, a polyacetal, a polycarbonate, a polyethylene terephthalate, or a denatured polyphenylene oxide.

The transparent display layer TDPL may be, for example, an organic light emitting layer. In this case, the cover member 30a may be divided into a transmitting part TA which transmits incident light as it is, a light emitting part LA which emits light, and a non-light emitting part NLA which does not emit light. The light emitting part LA may include a first light emitting part LA_R, a second light emitting part LA__G, and a third light emitting part LA_B which emit red light, green light, and blue light, respectively.

The transmitting part TA, the light emitting part LA, and the non-light emitting part NLA may be repeatedly disposed. In some exemplary embodiments, the transmitting part TA, the light emitting part LA, and the non-light emitting part NLA may be sequentially disposed in the order of the non-light emitting part NLA, the first light emitting part LA_R, the non-light emitting part NLA, the second light emitting part LA_G, the non-light emitting part NLA, the third light emitting part LA_B, the non-light emitting part NLA, and the transmitting part TA. However, the exemplary embodiments are not limited thereto, and the transmitting part TA, the light emitting part LA, and the non-light emitting part NLA may also be disposed in various ways. Because the transmitting part TA is disposed between the light emitting parts LA disposed repeatedly, it may have high light transmittance.

When the light emitting parts LA do not emit light, the background behind the cover member 30 may be visible through the transmitting parts TA. When the light emitting parts LA emit light, an image such as a keyboard image may be displayed on the cover member 30 by the light emitting parts LA.

The transparent display layer TDPL may include a buffer layer 102 disposed on the first substrate SUB1, a semiconductor layer 113 disposed on the buffer layer 102, a first insulating layer 103 disposed on the semiconductor layer 113, a first conductive layer 123 disposed on the first insulating layer 103, a second insulating layer 104 disposed on the first conductive layer 123, a second conductive layer 135 and 136 disposed on the second insulating layer 104, a first via layer 151 disposed on the second conductive layer 135 and 136, a third conductive layer 141 disposed on the first layer 151, a bank layer 152 disposed on the third conductive layer 141, an organic layer EL disposed between parts of the bank layer 152, a common electrode 160 disposed on the organic layer EL, an adhesive layer 170 disposed on the common electrode 160, and a black matrix BM disposed on the adhesive layer 170.

The functional layer FL may include a first sensing electrode layer SL1 disposed on the second substrate SUB2, an inorganic insulating layer IOL disposed on the first sensing electrode layer SL1, a second sensing electrode layer SL2 disposed on the inorganic insulating layer IOL, and an organic layer OL disposed on the second sensing electrode layer SL2. The function layer FL may be a touch sensor for sensing a touch input and/or a digitizer for receiving input from an external input device such as a stylus.

Referring to FIGS. 1 through 3, 6 and 10, in some exemplary embodiments, each adhesive member 33 may further include an electrode pad PAD electrically connected to the transparent display layer TDPL and/or the functional layer FL depicted in FIG. 15, as discussed below. In addition, the second hinge member 50 may further include a circuit that electrically connects a control device such as a computer mounted on the first support member 10 or the second support member 20 to the electrode pad PAD. Accordingly, in the second folded position, the display device 1 may display a keyboard image on the cover member 30a, may receive a user's touch input to the keyboard image, and may be used as a device such as a laptop. In some exemplary embodiments, any one of the transparent display layer TDPL and the functional layer FL may be omitted.

The cover member 30a of FIG. 10 is substantially the same or similar to the cover member 30 of FIGS. 1 through 9 except that it further includes the second substrate SUB2, the third substrate SUB3, the functional layer FL and the transparent display layer TDPL, and thus some description thereof will be omitted to avoid redundancy.

Figure 11:
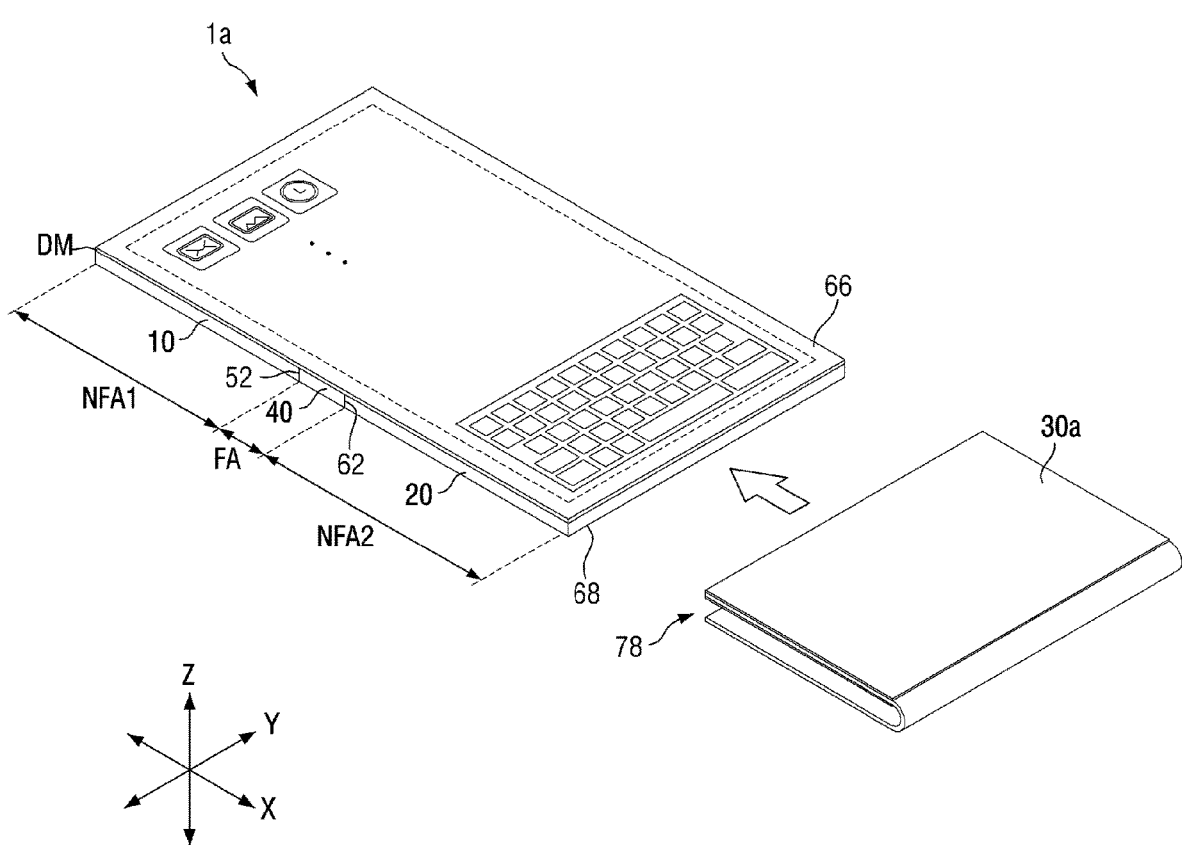
FIG. 11 is a perspective view of another exemplary embodiment of a display device constructed according to the principles of the invention. in an unfolded position
Figure 12:
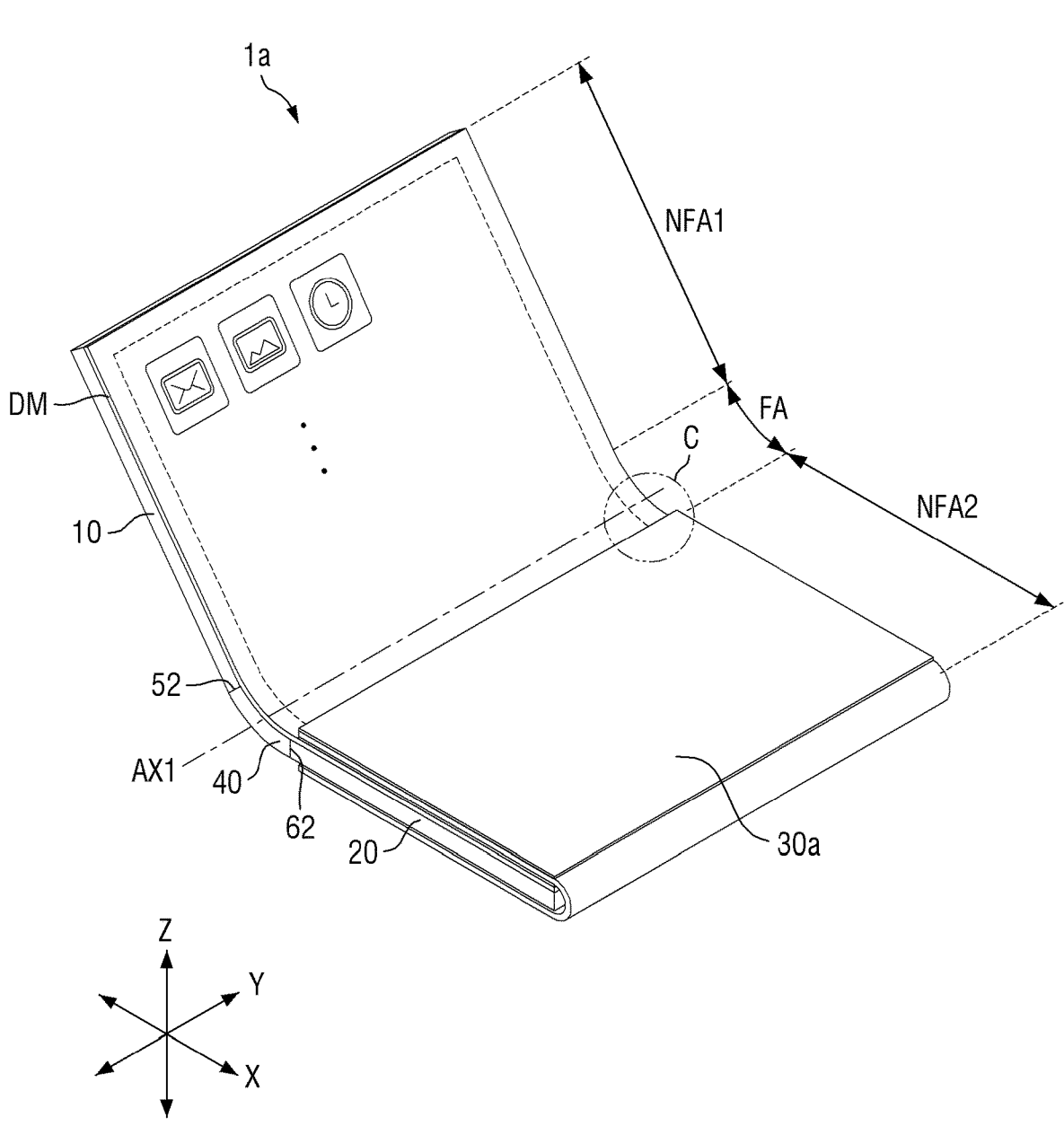
FIG. 12 is a perspective view of the display device of FIG. 11 in a first folded position.
Figure 13:
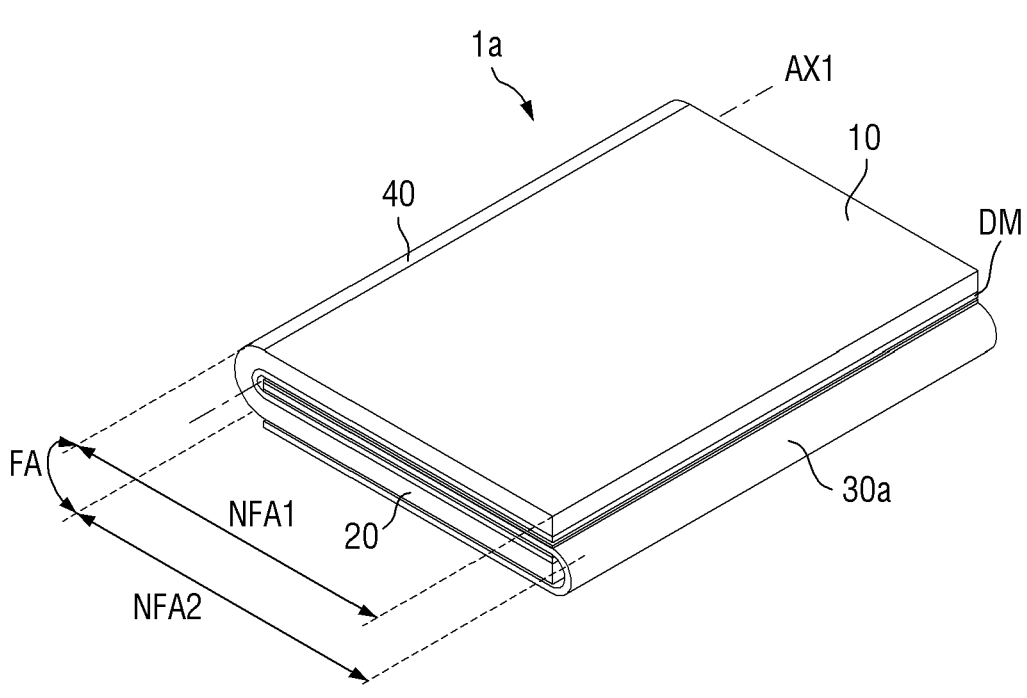
FIG. 13 is a perspective view of the display device of FIG. 11 in a second folded position.
Figure 13:
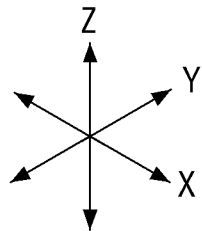
Figure 14:
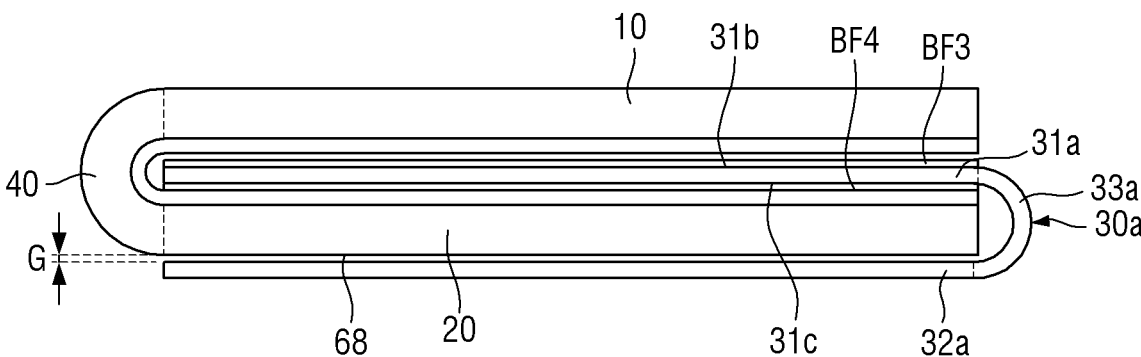
FIG. 14 is a cross-sectional view of the display device of FIG. 13.
Figure 14:
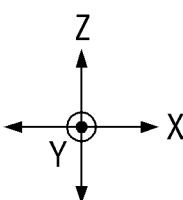

FIG. 11 is a perspective view of another exemplary embodiment of a display device constructed according to the principles of the invention. in an unfolded position FIG. 12 is a perspective view of the display device of FIG. 11 in a first folded position. FIG. 13 is a perspective view of the display device of FIG. 11 in a second folded position. FIG. 14 is a cross-sectional view of the display device of FIG. 13. FIG. 15 is an enlarged perspective view of an exemplary embodiment of part 'C' of FIG. 12.

The display device 1a of FIG. 11 is different from the display device 1 of FIGS. 1 through 9 in the shape of a cover member 30a and the coupling relationship of the cover member 30a with other members. Referring to FIGS. 11 through 15, the display device 1a includes a first support member 10, a second support member 20, the cover member 30a, and a first hinge member 40. The second support member 20 may not have first recessed parts 21, second recessed parts 22, and a protruding part 24 on a side, unlike the exemplary embodiment of FIGS. 1 through 9. The cover member 30a may be detachably coupled to a display module DM and/or the second support member 20.

The cover member 30a may have a generally U-shaped cross section. The cover member 30a may have one side in the first direction X open. An end 66 of the display module DM and/or an end 66 of the second support member 20 may be inserted into an open side 78 of the cover member 30a. Accordingly, the cover member 30a may surround a part of a front surface of the display module DM, a side surface of a side of the display module DM, a side surface of a side of the second support member 20, and a lower surface 68 of the second support member 20. In some exemplary embodiments, both sides of the cover member 30a in the second direction Y may also be open.

Referring to FIGS. 11 through 13, the display device 1a may have a first position in which the cover member 30a is separated from other members and a second position in which an end of the second support member 20 and an end of the display module DM are inserted into the cover member 30a.

The display device 1a may have the unfolded position, the first folded position and the second folded position. Here, the display device 1a may be in the second position. For example, the first support member 10 may be folded to the first folded position in which it forms an angle of greater than about 0 degrees and less than about 180 degrees with the second support member 20 in the second position. For another example, the first support member 10 may be folded to the second folded position in which it forms an angle of about 0 or about 360 degrees with the second support member 20 in the second position. In this case, the first support member 10 may overlap the second support member 20 in the thickness direction to be substantially parallel to the second support member 20.

Referring to FIG. 14, the cover member 30a may include a first substantially flat part 31a, a second substantially flat part 32*a*, and a connecting part 33*a*. In the second position, the first substantially flat part 31*a* may be disposed on an upper surface of the second support member 20 and/or a part of the front surface of the display module DM disposed in a second non-folding area NFA2. The second substantially flat part 32*a* may be disposed on the lower surface 68 of the second support member 20. The connecting part 33*a* may connect a side of the first substantially flat part 31*a* and a side of the second substantially flat part 32*a*. The connecting part 33*a* may be bent to have a predetermined curvature. The connecting part 33*a* may be bent to have, for example, a generally 'C'-shaped cross section.

In the second position, the first substantially flat part 31*a*, a part of the display module DM disposed in the second non-folding area NFA2, the second support member 20 and the second substantially flat part 32*a* may overlap in the thickness direction. In the second folded position, the first substantially flat part 31*a*, a part of the display module DM disposed in the second non-folding area NFA2, the second support member 20, the second substantially flat part 32*a*, another part of the display module DM disposed in a first non-folding area NFA1, and the first support member 10 may overlap in the thickness direction.

In the second position, the second substantially flat part 32*a* may be spaced apart from the lower surface 68 of the second support member 20 by a predetermined distance. In some exemplary embodiments, the second substantially flat part 32*a* may be in close contact with the lower surface 68 of the second support member 20. The cover member 30*a* may be made of a transparent glass or a plastic material having a predetermined strength. For example, the cover member 30*a* may be made of tempered glass such as an alumina silicate or a soda lime glass. For another example, the cover member 30*a* may be made of an industrial plastic material such as a polyamide, a polyacetal, a polycarbonate, a polyethylene terephthalate, or a denatured polyphenylene oxide.

The cover member 30*a* may further include a third buffer member BF3 disposed on a surface 31*b* of the first substantially flat part 31*a* and a fourth buffer member BF4 disposed on the other surface 31*c* of the first substantially flat part 31*a*. The third buffer member BF3 and the fourth member BF4 may be made of a transparent elastic material. For example, the third buffer member BF3 and the fourth buffer member BF4 may be made of a rubber or a polyurethane-based material. The third buffer member BF3 and the fourth buffer member BF4 may absorb external shock and prevent damage due to interference between members.

In some exemplary embodiments, at least one of the first substantially flat part 31*a* and the second substantially flat part 32*a* may include at least one of the first substrate SUB1, the transparent display layer TDPL, the second substrate SUB2, the functional layer FL, and the third substrate SUB3 of FIG. 10, as discussed above.

Figure 15:
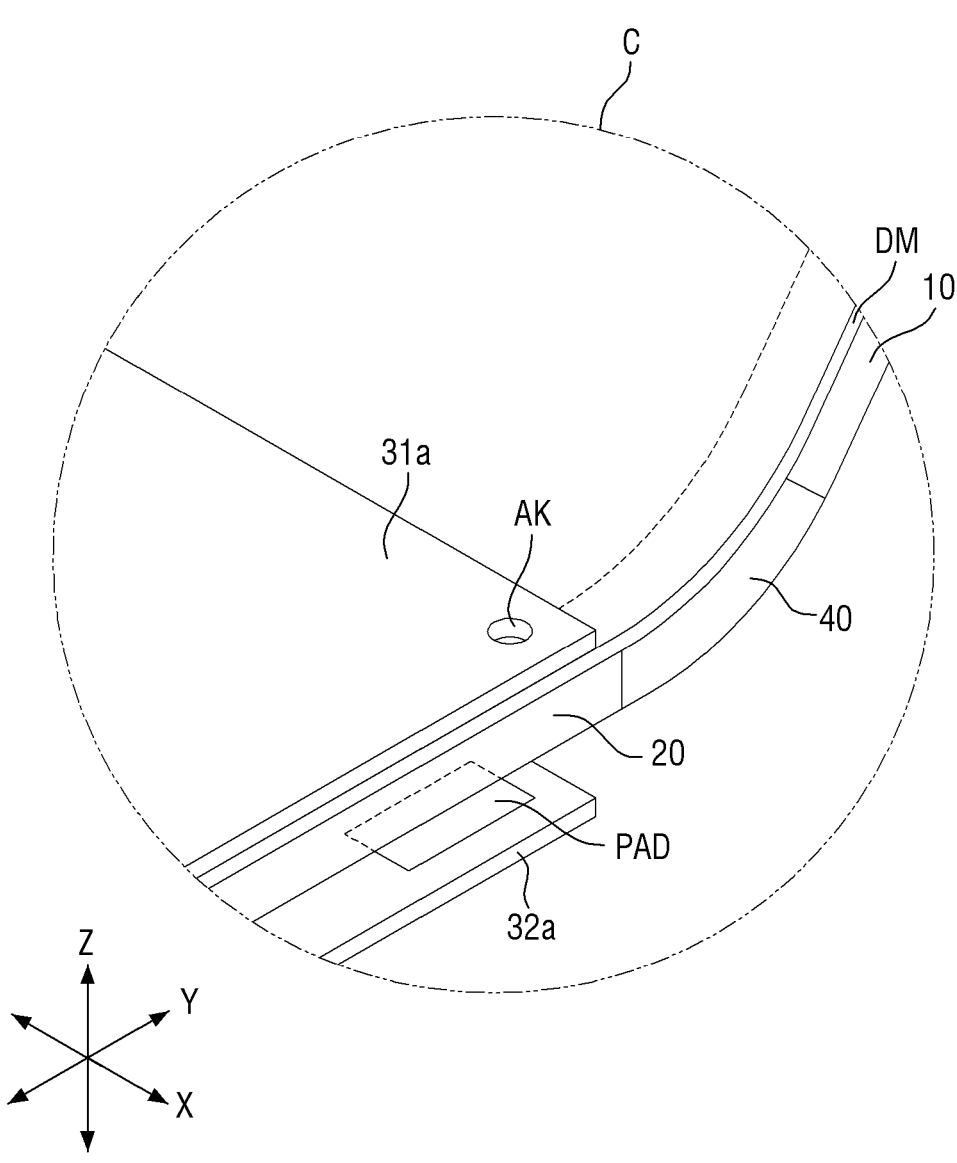
FIG. 15 is an enlarged perspective view of an exemplary embodiment of part 'C' of FIG. 12.

Referring to FIG. 15, the cover member 30*a* may further include keyholes AK and electrode pads PAD. The keyholes AK may be disposed in corner areas of the first substantially flat part 31*a* and/or the second substantially flat part 32*a*. The keyholes AK may align the positions of the cover member 30*a* and the second support member 20 in the second position. In some exemplary embodiments, a pair of keyholes AK may be disposed in the corner areas of the first substantially flat part 31*a*. In some exemplary embodiments, a pair of keyholes AK may be disposed in the corner areas of the second substantially flat part 32*a*. In some exemplary embodiments, the keyholes AK may be replaced with magnets.

The electrode pads PAD may be disposed in the corner areas of the first substantially flat part 31*a* and/or the second substantially flat part 32*a*. The electrode pads PAD may be electrically connected to the transparent display layer TDPL and/or the functional layer FL, as depicted in FIG. 10, disposed in the first substantially flat part 31*a* and/or the second substantially flat part 32*a*. In some exemplary embodiments, the electrode pads PAD may be disposed in the corner areas of the second substantially flat part 32*a*. Therefore, the electrode pads PAD may not be visible when the display device 1*a* is viewed from above. In some exemplary embodiments, the electrode pads PAD may be disposed in the corner areas of the first substantially flat part 31*a*.

Because the display device 1*a* of FIG. 11 is substantially the same or similar to the display device 1 of FIGS. 1 through 9 except for the shape of the cover member 30*a* and the coupling relationship of the cover member 30*a* with other members, a repetitive description thereof will be omitted to avoid redundancy.

Figure 16:
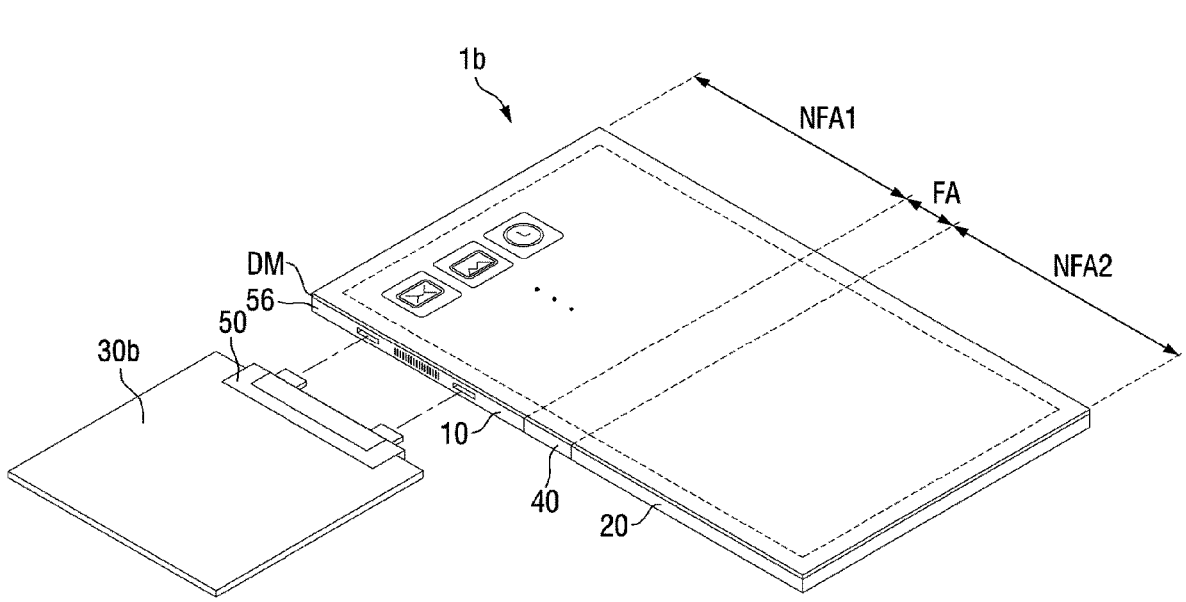
FIG. 16 is a perspective view of an exemplary embodiment of a display device constructed according to the principles of the invention. in an unfolded position.
Figure 16:
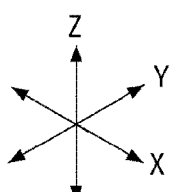
Figure 17:
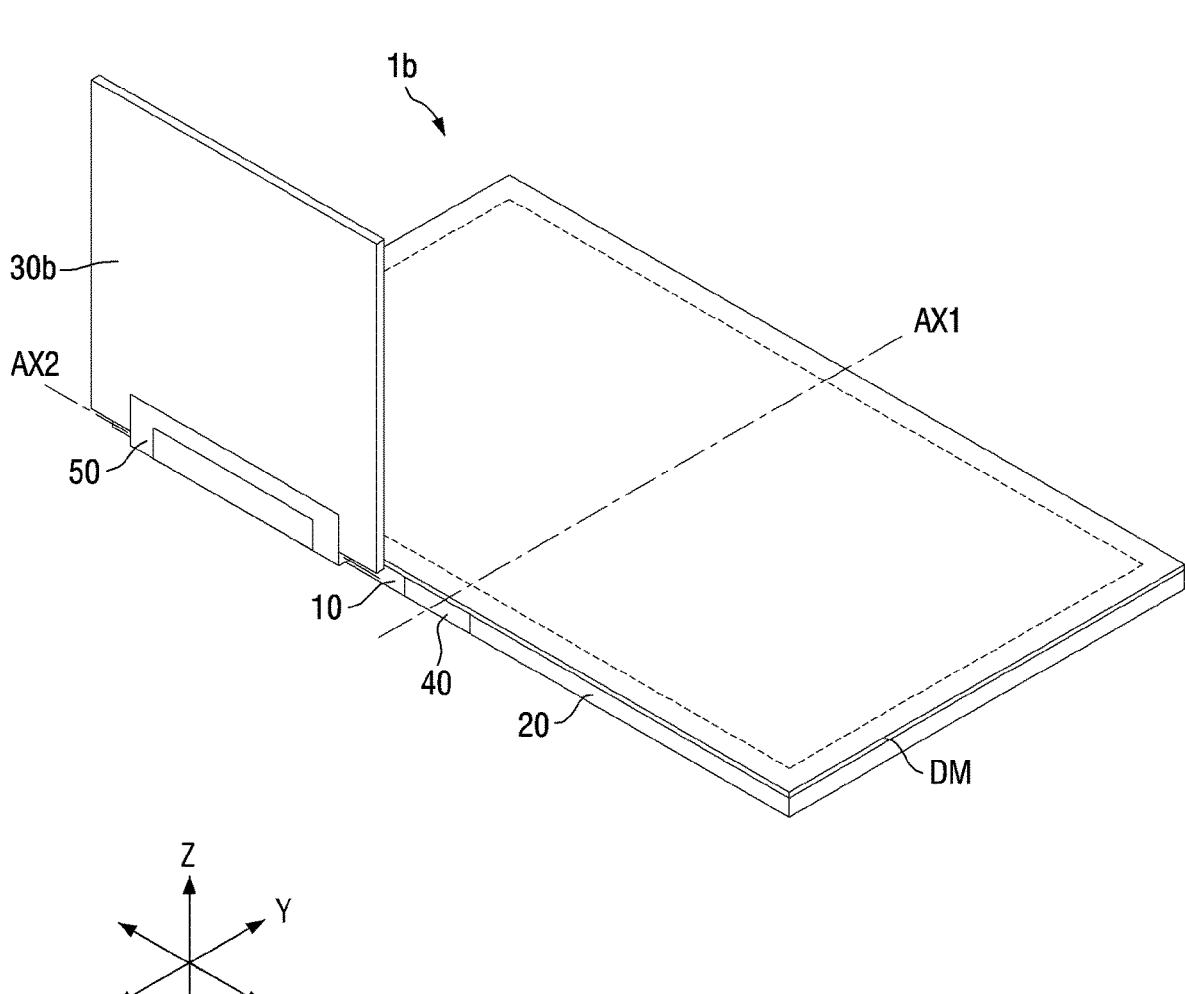
FIG. 17 is a perspective view of the display device of FIG. 16 in a first folded position.
Figure 17:
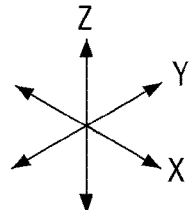
Figure 18:
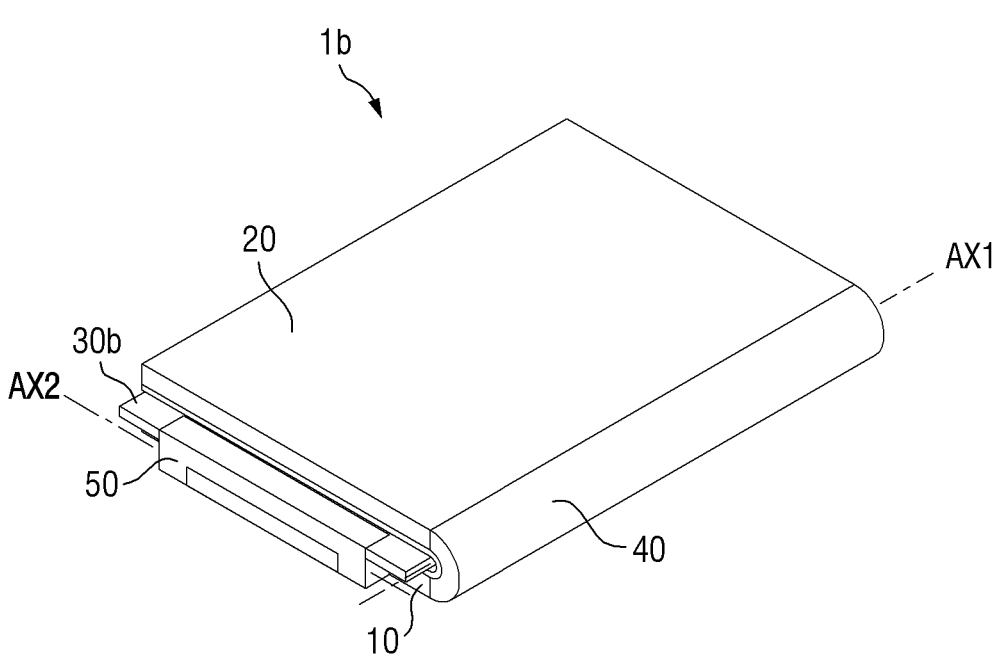
FIG. 18 is a perspective view of the display device of FIG. 16 in a second folded position.
Figure 18:
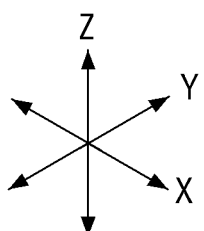

FIG. 16 is a perspective view of an exemplary embodiment of a display device constructed according to the principles of the invention. in an unfolded position. FIG. 17 is a perspective view of the display device of FIG. 16 in a first folded position. FIG. 18 is a perspective view of the display device of FIG. 16 in a second folded position.

Because the display device 1*b* of FIGS. 16-18 is substantially the same or similar to the display device 1 of FIGS. 1 through 9 except that the cover member 30*b* is coupled to the first support member 10, a repetitive description thereof will be omitted to avoid redundancy.

The display device 1*b* of FIG. 16 is different from the display device 1 of FIGS. 1 through 9 in that a cover member 30*b* is coupled to a first support member 10. The display device 1*b* includes the first support member 10, a second support member 20, the cover member 30*b*, a first hinge member 40, and a second hinge member 50.

The first support member 10, the second support member 20, and the cover member 30*b* are separated from each other. The first support member 10 and the second support member 20 may be sequentially arranged in the first direction X, and a display panel may be disposed on the first support member 10 and the second support member 20. The first hinge member 40 may connect the first support member 10 and the second support member 20 such that each of the first support member 10 and the second support member 20 can rotate around a first axis AX1 of the second direction Y.

The cover member 30*b* may be detachably coupled to the first support member 10. Particularly, the cover member 30*b* may be detachably coupled to a side surface of the first support member 10, which extends in the first direction X, by the second hinge member 50. The second hinge member 50 may connect the first support member 10 and the cover member 30*b* such that each of the first support member 10 and the cover member 30*b* can rotate around a second axis AX2 of the first direction X. In some exemplary embodiments, the second hinge member 50 may be disposed in the cover member 30*b*.

The display device 1*b* may have a first position in which the first support member 10 and the cover member 30*b* are separated from each other and a second position in which the first support member 10 and the cover member 30*b* are coupled to each other. The display device 1*b* may have the unfolded position, the first folded position, and the second folded position. As depicted in FIG. 17, the display device 1*b* may be in the second position.

The first folded position may be a position in which the cover member 30b is folded to form a predetermined angle with the first support member 10 with respect to the second axis AX2. For example, the predetermined angle may be greater than about 0 degrees and less than about 180 degrees. The first folded position may include a position in which the first support member 10 is folded to form a predetermined angle with the second support member 20. For example, the predetermined angle may be greater than about 90 degrees and less than about 180 degrees.

The second folded position may be a position in which the cover member 30b and the first support member 10 overlap in the thickness direction to be substantially parallel to each other. The second folded position may be a position in which the cover member 30b and the first support member 10 may completely overlap. Here, an angle formed by the cover member 30b and the first support member 10 may be about 0 degrees.

The second folded position may include a position in which the first support member 10, the second support member 20, and the cover member 30b overlap in the thickness direction to be substantially parallel to each other. In some exemplary embodiments, in the second folded position, the first support member 10, the cover member 30b, and the second support member 20 may be sequentially disposed from the bottom to overlap in the thickness direction.

The cover member 30b may be made of a transparent glass or a plastic material having a predetermined strength. For example, the cover member 30b may be made of tempered glass such as an alumina silicate or a soda lime glass. For another example, the cover member 30b may be made of an industrial plastic material such as a polyamide, a polyacetal, a polycarbonate, a polyethylene terephthalate, or a denatured polyphenylene oxide.

In some exemplary embodiments, referring to FIGS. 10 and 16 through 18, the cover member 30b may include at least one of a first buffer member BF1, a first substrate SUB1, a transparent display layer TDPL, a second substrate SUB2, a functional layer FL, a third substrate SUB3, and a second buffer member BF2. In some exemplary embodiments, the cover member 30b may include a mechanical keyboard.

Foldable display devices constructed according to the various embodiments of the invention provide for sufficient thinness to facilitate folding but also protect the display module from external impact.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising: a display panel having an upper surface to display an image and a lower surface; a first support member and a second support member disposed on the lower surface of the display panel, the second support member comprising a protruding part; a first hinge connecting a side of the first support member and a side of the second support member and defining a first axis; a cover disposed on another side of the second support member, the cover comprising a pair of attachment parts and defining, between the pair of attachment parts, a notch in which the protruding part is accommodated; and a second hinge connecting the another side of the second support member and a side of the cover, the second hinge comprising: a shaft received in the protruding part to define and defining a second axis substantially parallel to the first axis; and a pair of coupling members supported at either end of the shaft, each coupling member of the pair of coupling members being connected to a corresponding attachment part of the pair of attachment parts; and the second support member comprises: a pair of first recessed parts disposed at both corners adjacent to the cover; a pair of second recessed parts, each of which is additionally recessed from a surface of each first recessed part of the pair of first recessed parts; and a pair of step parts, each of which is formed by each first recessed part of the pair of first recessed parts and a corresponding second recessed part of the pair of second recessed parts.

2. The display device of claim 1, wherein at least one of the pair of coupling members comprises a body part and an extension formed integrally with a side of the body part.

3. The display device of claim 2, wherein the extension comprises an extension part configured to rotate around the second axis to be received in the second recessed part.

4. The display device of claim 1, wherein at least one coupling member of the pair of coupling members is connected to the corresponding attachment part of the pair of attachment parts by one or more adhesive members or a magnet.

5. The display device of claim 1, wherein the cover comprises a cover member including a first substrate, a first buffer layer disposed on a surface of the first substrate, and a second buffer layer disposed on another surface of the first substrate.

6. The display device of claim 5, wherein the first buffer layer and the second buffer layer comprise a polyurethane-based material.

7. The display device of claim 1, wherein the display panel comprises a first non-folding area disposed on the first support member, a second non-folding area disposed on the second support member and a folding area disposed on the first hinge, and the cover is rotatable around the second axis to overlap the second non-folding area in a thickness direction.

8. The display device of claim 1, wherein the cover comprises a transparent material.

* * * * *